(12) United States Patent
Kato

(10) Patent No.: US 7,869,250 B2
(45) Date of Patent: Jan. 11, 2011

(54) ROM SEMICONDUCTOR INTEGRATED CIRCUIT DEVICE HAVING A PLURALITY OF COMMON SOURCE LINES

(75) Inventor: Kei Kato, Tokyo (JP)

(73) Assignee: Renesas Electronics Corporation, Kawasaki (JP)

( * ) Notice: Subject to any disclaimer, the term of this patent is extended or adjusted under 35 U.S.C. 154(b) by 43 days.

(21) Appl. No.: 12/134,705

(22) Filed: Jun. 6, 2008

(65) Prior Publication Data

US 2009/0003029 A1 Jan. 1, 2009

(30) Foreign Application Priority Data

Jun. 11, 2007 (JP) ............................. 2007-153541
Apr. 30, 2008 (JP) ............................. 2008-118506

(51) Int. Cl.
*G11C 17/14* (2006.01)

(52) U.S. Cl. ...................... 365/104; 365/103; 365/72; 365/63; 365/51

(58) Field of Classification Search .............. 365/104, 365/103, 72, 63, 51
See application file for complete search history.

(56) References Cited

U.S. PATENT DOCUMENTS 7,102,926 B2* 9/2006 Lee et al. ............... 365/185.11
7,218,544 B2 5/2007 Yamauchi
7,324,397 B2* 1/2008 Miyazaki et al. ......... 365/210.1
2003/0235096 A1* 12/2003 Chen et al. .................. 365/201

FOREIGN PATENT DOCUMENTS

JP 2005-327339 11/2005

* cited by examiner

*Primary Examiner*—Andrew Q Tran
(74) *Attorney, Agent, or Firm*—Mattingly & Malur, P.C.

(57) ABSTRACT

In a semiconductor integrated circuit device having a volatile memory high-speed operation is enabled and the density of the memory can be enhanced. The volatile memory includes a word line, a complementary bit line having bit lines, a plurality of common source lines, and a memory cell that is coupled with the word line and the complementary bit lines. The memory cell includes transistors. The gate electrodes of the transistors are coupled with the word line, and the drain electrode of one of the transistors is coupled with one of the bit lines. The drain electrode of the other transistor is coupled with the other bit line. The respective source electrodes of the transistors are coupled with any one of the common source lines, or brought in a floating state, thereby storing storage information in the memory cell.

12 Claims, 20 Drawing Sheets

LAYOUT PATTERN (PROGRAM LAYER OF ROM) INDICATIVE OF COUPLING OF CS LINE (Metal4) AND MOS SOURCE (Metal3)

FIG. 7
(a) 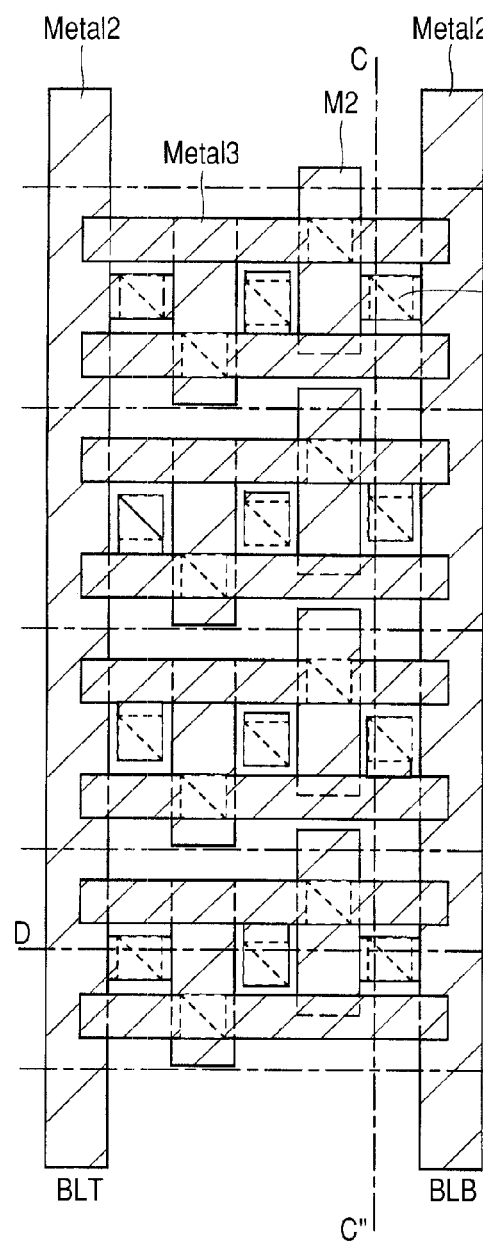
LAYOUT PATTERN OF ROM PROGRAM
LAYER USING METAL 3 LAYER
(b) 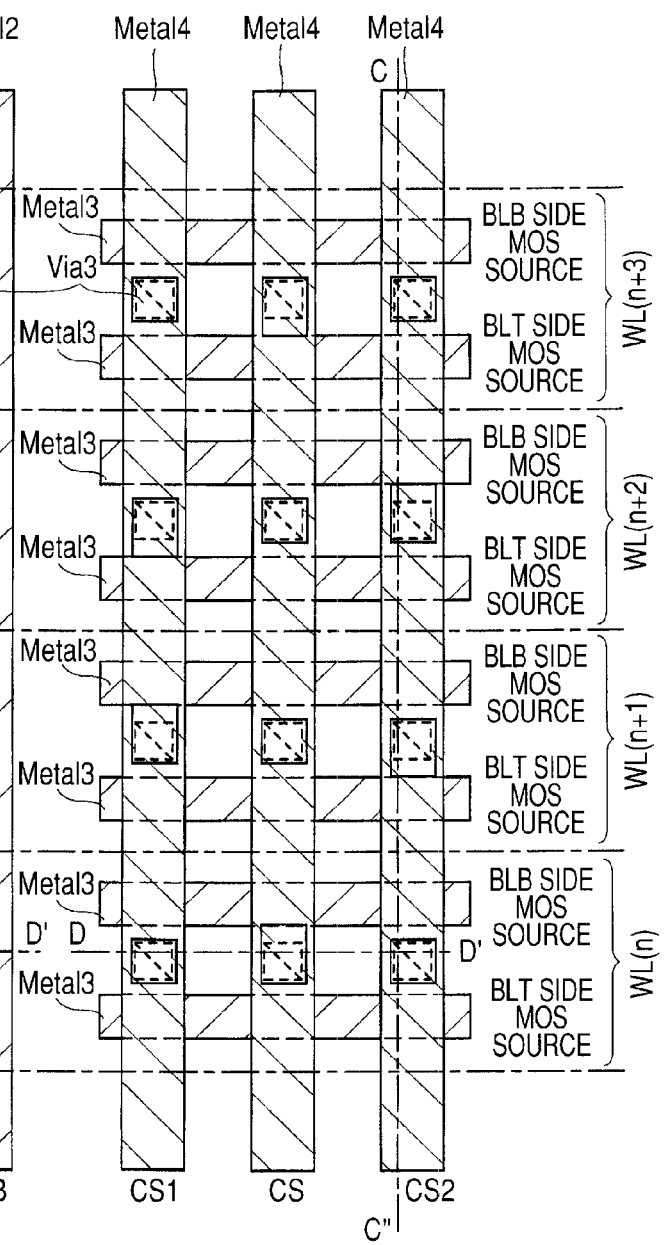
LAYOUT PATTERN OF CS LINE (Metal4)
AND MOS SOURCE (Metal3)

FIG. 10

SELECTED ADDRESS A, INTERNAL STATE, DATA OUTPUT Q

| TERMINAL NAME / READ ADDRESS | A0 | A1 | A2 | EN | WL (n) | WL (n+1) | WL (n+2) | WL (n+3) | CS1 | CS2 | CS | BLT | BLB | Q |
|---|---|---|---|---|---|---|---|---|---|---|---|---|---|---|
| 0 | L | L | L | H | H | L | L | L | L | H | L | H | L | H |
| 1 | H | L | L | H | H | L | L | L | H | L | L | H | L | H |
| 2 | L | H | L | H | L | H | L | L | L | H | L | H | L | H |
| 3 | H | H | L | H | L | H | L | L | H | L | L | L | H | L |
| 4 | L | L | H | H | L | L | H | L | L | H | L | L | H | L |
| 5 | H | L | H | H | L | L | H | L | H | L | L | H | L | H |
| 6 | L | H | H | H | L | L | L | H | L | H | L | L | H | L |
| 7 | H | H | H | H | L | L | L | H | H | L | L | L | H | L |
| NON-SELECTED (PAUSE STATE) | X | X | X | L | L | L | L | L | H | H | H | H | H | - |

FIG. 14

SELECTED ADDRESS A, INTERNAL STATE, DATA OUTPUT Q

| READ ADDRESS / TERMINAL NAME | A0 | A1 | A2 | A3 | EN | WL (n) | WL (n+1) | WL (n+2) | WL (n+3) | CS1 | CS2 | CS3 | CS4 | CS | BLT | BLB | Q |
|---|---|---|---|---|---|---|---|---|---|---|---|---|---|---|---|---|---|
| 0 | L | L | L | L | H | H | L | L | L | L | Hi-Z | Hi-Z | Hi-Z | L | H | L | H |
| 1 | H | L | L | L | H | H | L | L | L | Hi-Z | L | Hi-Z | Hi-Z | L | H | L | H |
| 2 | L | H | L | L | H | H | L | L | L | Hi-Z | Hi-Z | L | Hi-Z | L | H | L | H |
| 3 | H | H | L | L | H | H | L | L | L | Hi-Z | Hi-Z | Hi-Z | L | L | H | L | H |
| 4 | L | L | H | L | H | L | H | L | L | L | Hi-Z | Hi-Z | Hi-Z | L | H | L | H |
| 5 | H | L | H | L | H | L | H | L | L | Hi-Z | L | Hi-Z | Hi-Z | L | L | H | L |
| 6 | L | H | H | L | H | L | H | L | L | Hi-Z | Hi-Z | L | Hi-Z | L | H | L | H |
| 7 | H | H | H | L | H | L | H | L | L | Hi-Z | Hi-Z | Hi-Z | L | L | L | H | L |
| 8 | L | L | L | H | H | L | L | H | L | L | Hi-Z | Hi-Z | Hi-Z | L | L | H | L |
| 9 | H | L | L | H | H | L | L | H | L | Hi-Z | L | Hi-Z | Hi-Z | L | H | L | H |
| 10 | L | H | L | H | H | L | L | H | L | Hi-Z | Hi-Z | L | Hi-Z | L | H | L | H |
| 11 | H | H | L | H | H | L | L | H | L | Hi-Z | Hi-Z | Hi-Z | L | L | H | L | H |
| 12 | L | L | H | H | H | L | L | L | H | L | Hi-Z | Hi-Z | Hi-Z | L | H | L | H |
| 13 | H | L | H | H | H | L | L | L | H | Hi-Z | L | Hi-Z | Hi-Z | L | L | H | L |
| 14 | L | H | H | H | H | L | L | L | H | Hi-Z | Hi-Z | L | Hi-Z | L | L | H | L |
| 15 | H | H | H | H | H | L | L | L | H | Hi-Z | Hi-Z | Hi-Z | L | L | H | L | L |
| NON-SELECTED (PAUSE STATE) | X | X | X | X | L | L | L | L | L | H | H | H | H | H | H | H | - |

SELECTED ADDRESS A, INTERNAL STATE, DATA OUTPUT Q  ※ A0: COLUME SELECT, A2,A1: ROW SELECT

| TERMINAL NAME / READ ADDRESS | A0a/A0b | A1a/A1b | A2a/A2b | EN | WL (n) | WL (n+1) | WL (n+2) | WL (n+3) | CS1a | CS2a | CS1b | CS2b | CSa | CSb | BLTa | BLBa | BLTb | BLBb | Qa | Qb |
|---|---|---|---|---|---|---|---|---|---|---|---|---|---|---|---|---|---|---|---|---|
| 0 | L | L | L | H | H | L | L | L | L | Hi-Z | L | Hi-Z | L | L | H | L | H | L | H | H |
| 1 | H | L | L | H | H | L | L | L | Hi-Z | L | Hi-Z | L | L | L | L | H | L | H | H | H |
| 2 | L | H | L | H | L | H | L | L | L | Hi-Z | L | Hi-Z | L | L | H | L | L | H | L | L |
| 3 | H | H | L | H | L | H | L | L | Hi-Z | L | Hi-Z | L | L | L | L | H | H | L | L | L |
| 4 | L | L | H | H | L | L | H | L | L | Hi-Z | L | Hi-Z | L | L | H | L | H | L | H | L |
| 5 | H | L | H | H | L | L | H | L | Hi-Z | L | Hi-Z | L | L | L | L | H | L | H | L | H |
| 6 | L | H | H | H | L | L | L | H | L | Hi-Z | L | Hi-Z | L | L | H | L | L | H | H | H |
| 7 | H | H | H | H | L | L | L | H | Hi-Z | L | Hi-Z | L | L | L | L | H | H | L | H | L |
| NON-SELECTED (PAUSE STATE) | X | X | X | L | L | L | L | L | H | H | H | H | H | H | H | H | H | H | - | - |

FIG. 17

FIG. 19(a)
PRIOR ART
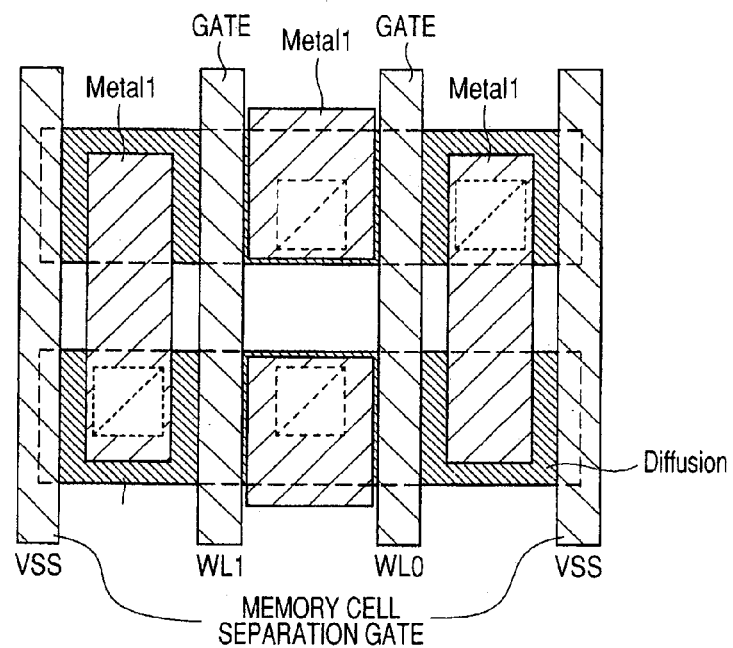
FIG. 19(b)
PRIOR ART
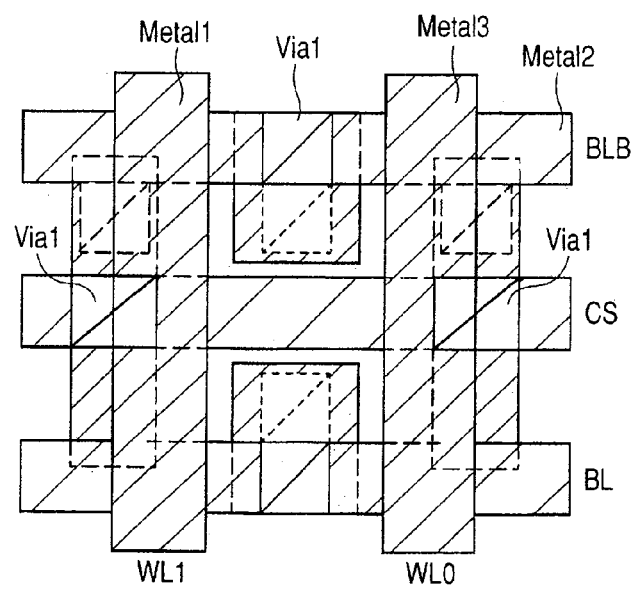
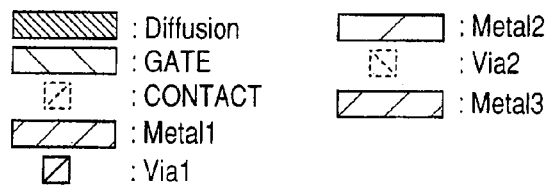

ROM SEMICONDUCTOR INTEGRATED CIRCUIT DEVICE HAVING A PLURALITY OF COMMON SOURCE LINES

CROSS-REFERENCE TO RELATED APPLICATIONS

The disclosure of Japanese Patent Application No. 2008-118506 and No. 2007-153541 respectively filed on Apr. 30, 2008 and on Jun. 11, 2007 each including the specification, drawings and abstract are incorporated herein by reference in its entirety.

BACKGROUND OF THE INVENTION

The present invention relates to a semiconductor integrated circuit device, and more particularly to a technique that is effectively applied to a system LSI (large scale integrated circuit) including a nonvolatile memory such as a mask ROM (read only memory).

The present inventors have studied the following techniques, for example, in the ROM that is equipped in the system LSI.

For example, there exists a ROM equipped in the system LSI in which the word configuration of the ROM is mainly medium-scale and large-scale, and in order to obtain stable and high-speed operation, a memory cell array is of a complementary bit line structure to conduct read operation at high speed by a differential sense amplifier. The ROM of the complementary bit line structure includes memory cells, word lines, complementary bit lines, and differential sense amplifiers that are coupled with the complementary bit lines. Each of the memory cells includes a pair of first and second MOS transistor having gate electrodes coupled with the same word line, respectively. One source/drain electrodes of the first and second MOS transistors are coupled with the corresponding bit lines of complementary bit lines BL and BLB, separately. The other source/drain electrode of the first MOS transistor is coupled with a voltage signal line (common source line) to which a given voltage is applied, and the other source/drain electrode of the second MOS transistor is brought in a floating state.

As a method of writing data in the above ROM, there is a method in which the presence/absence of an electric coupling is produced in the source or drain of an NMOS transistor according to the presence/absence of a through-hole between a first metal layer and a second metal layer. Also, there is a method in which the presence/absence of the electric coupling is produced according to the presence/absence of a through-hole between a diffusion layer and the first metal layer.

FIG. 18 shows an example of the configuration of the ROM memory cell that has been studied as the premise of the present invention. FIG. 18 is an equivalent circuit showing a memory cell for two bits and its coupling. The real memory array is configured in such a manner that the memory cells are arranged and coupled on the array in accordance with a required word configuration and column configuration. In FIG. 18, each of MC(1) and MC(2) corresponds to the memory cell for one bit, and the gates of the MOS transistors that forms the respective memory cells are coupled with word lines WL0 and WL1, respectively. Also, the drains of the MOS transistors within the memory cell are coupled with bit lines BLB and BL. Any one source of the pair of transistors within the cell memory is coupled with a common source line CS by the provision of a CONTACT layer on a layout pattern. That is, a ROM perforation layer is a contact (CONTACT) layer, and information is written according to the provision of the contact layer on which source electrode of the two MOS transistors. With the coupling the common source line CS with the source of any one transistor, any one of the bit lines BLB and BL is coupled with the common source line CS when any one of the word lines WL0 and WL1 is selected, thereby making it possible to induce a potential change in the bit line BLB or BL to read the memory cell information. More specifically, when the word line WL0 is made high level, and the common source line CS is made low level, the potential of BLB in the bit lines BL and BLB that have been precharged to the high level drops. The potential change in the BLB is amplified by the sense amplifier, thereby enabling the memory cell information to be read. Likewise, when the word line WL1 is made high level, and the common source line CS is made low level, the potential of BL in the bit lines BL and BLB drops to read the information.

FIGS. 19(a) and 19(b) show the layout diagrams of the ROM memory cell for two bits corresponding to the equivalent circuit shown in FIG. 18. FIG. 19(a) is a diagram showing the layout pattern of the diffusion layers (Diffusion) that form the MOS transistor, gate layers (GATE), the first metal layers (Metal1) that are extraction electrodes of the sources and the drains, and the contact layers (CONTACT) that couple the diffusion layers with the first metal layers. The two contact layers and the first metal layer which are positioned at the center portion are layers for coupling the drain of the MOS transistor with the bit lines BL and BLB. The gate layers (GATE) that are positioned at both sides of the center portion form the word lines WL0 and WL1, respectively. Further, the contact layers and the first metal layers which are arranged at the outer side thereof are layers for coupling any one source electrode of the paired upper and lower MOS transistors with the common source line CS. That is, the ROM perforation layer is the contact (CONTACT) layer, and the information is written according to the provision of the contact layer on which source electrode of the two MOS transistors. The gate layers that are formed at the outer side thereof are separation gates for separation from the MOS transistors of the adjacent memory cells.

FIG. 19(b) is a diagram showing the layout pattern of the upper layer of FIG. 19(a). The bit lines BL and BLB are formed of the second metal layers (Metal2), and coupled with the first metal layers that are the source electrodes of the MOS transistors of lower layers through via 1 (Via1). The common source lines CS are also formed of the second metal layers (Metal2), and coupled with the first metal layers that are the drain electrodes of the MOS transistors of the lower layers through the via 1 (Via1). The word lines WL0 and WL1 are formed of third metal layers (Metal3). The word lines WL0 and WL1 that are formed of the gate layers of FIG. 19(a) are coupled with the word lines WL0 and WL1 that are formed of the third metal layers of FIG. 19(b) in a word shunt pattern not shown in the layouts of FIGS. 19(a) and 19(b). The word shunt pattern is regularly arranged according to the necessity of a reduction in the word line resistor, for example, every four bits or eight bits.

FIG. 20 shows an example of the coupling of the ROM memory cell with the differential sense amplifier. The complementary bit lines BL and BLB are coupled with global bit lines gb1 and gb1b through a column switch. The global bit lines gb1 and gb1b are coupled with the input terminals of the differential sense amplifier, an equalizer circuit, and an output latch.

FIG. 21 shows a coupling diagram of the ROM memory cell. As shown in FIG. 21, any one of the MOS transistors is coupled with the CS line by ROM perforation to store data.

The MOS transistor that has not been subjected to ROM perforation serves as a switch that changes the potential of the bit line b1 or b1b even if the wordline w1 is selected. However, the diffusion capacities of the MOS transistors that are coupled with the bit lines b1 and b1b are equal to each other. As a result, the input capacity of the differential sense amplifier becomes balanced. This enables the stable high-speed read operation.

FIG. 22 shows a timing chart of the read operation of the ROM memory cell through a common source control system that has been studied as the premise of the present invention. The read operation starts from the operation of taking an address within a control circuit in synchronism with a leading edge of a clock. One of the word line signals w1 is driven to high level from a decoder on the basis of an address signal and a read instruction command which are output from the control circuit. In this operational example, the word line w1 n+3 is selected. Also, one of Y switch control signals yse [n:0] is driven to the high level, and the bit lines b1 and b1b and the global bit lines gb1 and gb1b are coupled with each other through a Y switch. On the other hand, the common source line CS is driven to low level. The word line w1 n+3 is driven to the high level, and the common source line CS is driven to the low level, as a result of which the potential difference between the bit lines b1 and b1b increases according to information that has been written in the memory cell. When the potential difference between the bit lines b1 and b1b increases to some degree, a sense amplifier enable signal sae is output from the control circuit to conduct the amplifying operation by the sense amplifier. Then, the potential difference between the global bit lines gb1 and gb1b increases to the high level and the low level. When the potential difference between the global bit lines gb1 and gb1b increases, the output latch is inverted according to the read data. When the read data is in an initial state or identical with the previous read data, the output latch is not inverted, and holds the data.

In the ROM of this configuration, because both of the common source line CS that is coupled with the source node of the memory cell, and the bit lines b1 and b1b which are coupled with the drain node thereof are set to Vdd during a period other than the read time, a leak current at the memory portion is remarkably reduced. Also, when the CS select timing is set after the word is selected, an affect (leak current) of the unselected memory cell can be reduced.

As the technique related to the above ROM, there is, for example, a technique disclosed in Japanese Unexamined Patent Publication No. 2005-327339.

SUMMARY OF THE INVENTION

Incidentally, as a result that the present inventors have studied the technique of the above semiconductor integrated circuit device, the following matters have been proved.

For example, in the case of the memory cell of the above complementary bit line structure, the high-speed operation is enabled. However, because one memory cell requires two transistors, and cannot store more than one piece of data, it is disadvantageous from the viewpoint of the density.

Under the above circumstances, an object of the present invention is to provide a technique that is capable of conducting high-speed operation and enhancing the density of the memory in a semiconductor integrated circuit device having a nonvolatile memory therein.

Also, in the above technique of the semiconductor integrated circuit device, the program of the memory cell is conducted according to the presence/absence of the coupling of the MOS transistor which forms the memory cell with the bit line. As usual, programming is conducted by the presence/absence of a contact of the drain diffusion layer with the first metal layer wiring of the bit line on its upper layer, or a contact of the first metal layer wiring that is coupled with the drain diffusion with the second metal wiring that is positioned over its upper layer. In the system, the program should be determined before the lower layer metal is completed in the relative initial stage of a semiconductor manufacturing process, and the program of the memory cell cannot be rewritten in the second half of the manufacturing process. For example, there arises such a problem that rewrite is disenabled when a subject wiring process has been completed in the case where a bug is included in the program.

Under the above circumstances, another object of the present invention is to provide a technique in which the memory can be written in the upper layer wiring in the second half of the semiconductor manufacturing process.

The above and other objects and novel features of the present invention will become apparent from the description of the present invention and the attached drawings.

The typical features of the invention described in the present application will be described as follows.

That is, the semiconductor integrated circuit device according to the present invention is directed to a semiconductor integrated circuit device having a nonvolatile memory. The nonvolatile memory includes a word line, a complementary bit line including first and second bit lines, first, second, and third common source lines, a memory cell that is coupled with the word line and the complementary bit line, and a differential sense amplifier that is coupled with the complementary bit line. The memory cell includes first and second transistors, the gate electrodes of the first and second transistors are coupled with the word line, the drain electrode of the first transistor is coupled with the first bit line, and the drain electrode of the second transistor is coupled with the second bit line. Each source electrode of the first and second transistors is coupled with any one of the first, second, and third common source lines, or brought in a floating state, to thereby store memory information in the memory cell.

Also, the nonvolatile memory includes a word line, a complementary bit line including first and second bit lines, first to fifth common source lines, a memory cell that is coupled with the word line and the complementary bit line, and a differential sense amplifier that is coupled with the complementary bit line. The memory cell includes the first and second transistors, the gate electrodes of the first and second transistors are coupled with the word line, the drain electrode of the first transistor is coupled with the first bit line, the drain electrode of the second transistor is coupled with the second bit line, each source electrode of the first and second transistors is coupled with any one or more of the first to fifth common source lines or brought in a floating state, to thereby store memory information in the memory cell.

The advantages that are obtained by the typical features of the invention described in the present application will be described as follows.

Since a plurality of data values can be stored within one memory cell, the density of the memory is improved.

BRIEF DESCRIPTION OF THE DRAWINGS

FIGS. 5(a) and 5(b) are layout diagrams showing the configuration of the memory mat main portion in the semiconductor integrated circuit device according to the first embodiment of the present invention, in which FIG. 5(a) shows the metal of the MOS and the source/drain, and FIG. 5(b) shows the metal of the MOS source;

FIG. 6 is a layout diagram showing the configuration of the memory mat main portion in the semiconductor integrated circuit device according to the first embodiment of the present invention, in which FIG. 6 shows a connection of CS line and MOS source;

FIGS. 7(a) and 7(b) are layout diagrams showing the configuration of the memory mat main portion in the semiconductor integrated circuit device according to the first embodiment of the present invention, in which FIG. 7(a) shows the ROM rewrite of the third metal layer, and FIG. 7(b) shows the coupling of the CS line with a third metal layer;

FIG. 10 is a state diagram showing a selected address, an internal state, and a data output in the semiconductor integrated circuit device according to the first embodiment of the present invention;

FIG. 14 is a state diagram showing a selected address, an internal state, and a data output in the semiconductor integrated circuit device according to the second embodiment of the present invention;

FIG. 17 is a state diagram showing a selected address, an internal state, and a data output in the semiconductor integrated circuit device according to the third embodiment of the present invention;

FIGS. 19(a) and 19(b) are diagram diagrams showing an example of the configuration of a ROM memory cell that has been studied as the premise of the present invention, in which FIG. 19(a) shows the metal of the MOS and the source/drain, and FIG. 19(b) shows the metal of the bit line and the MOS source;

DETAILED DESCRIPTION OF THE PREFERRED EMBODIMENTS

Hereinafter, a description will be given in more detail of embodiments of the present invention with reference to the accompanying drawings. In all of the drawings for describing the embodiments, the same members are denoted by identical symbols in principle, and their duplex description will be omitted.

First Embodiment

Figure 1:
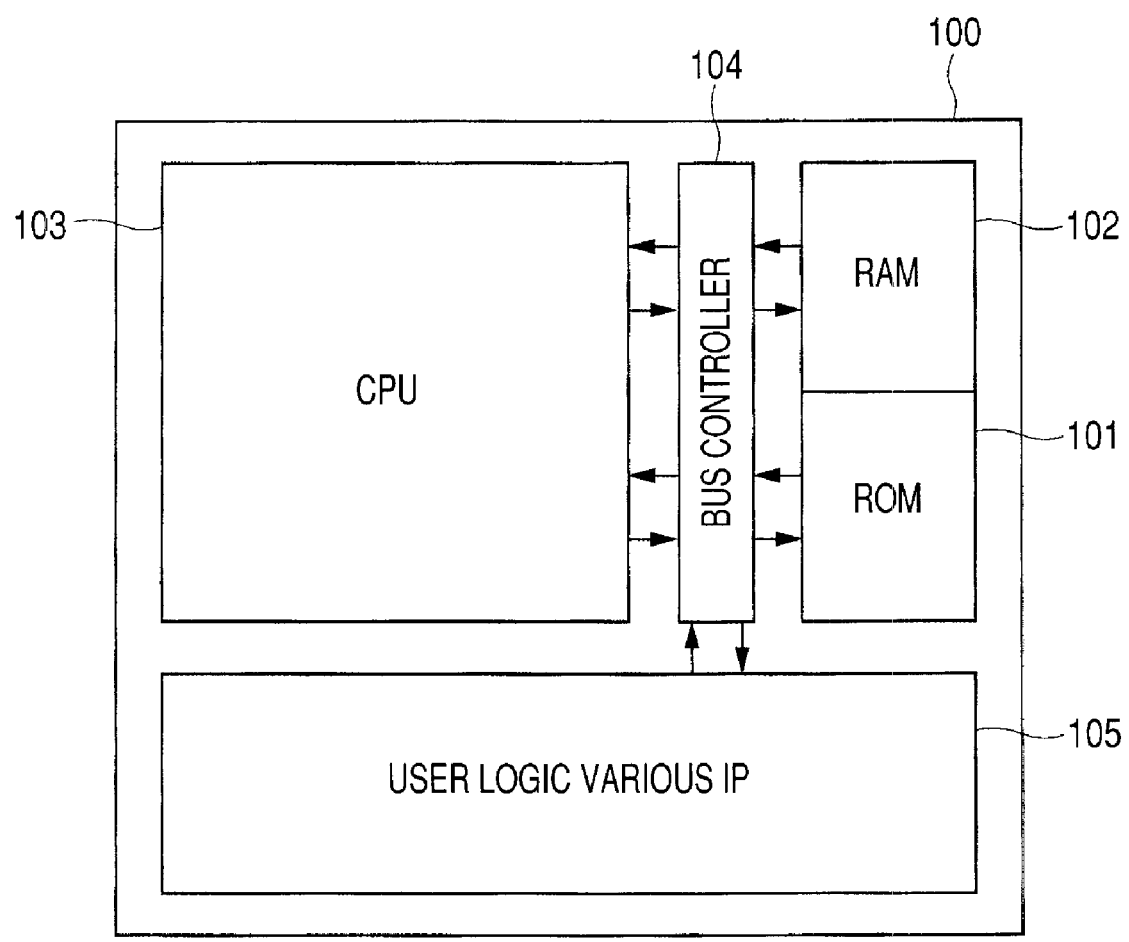
FIG. 1 is a block diagram showing the configuration of a semiconductor integrated circuit device according to a first embodiment of the present invention.
Figure 2:
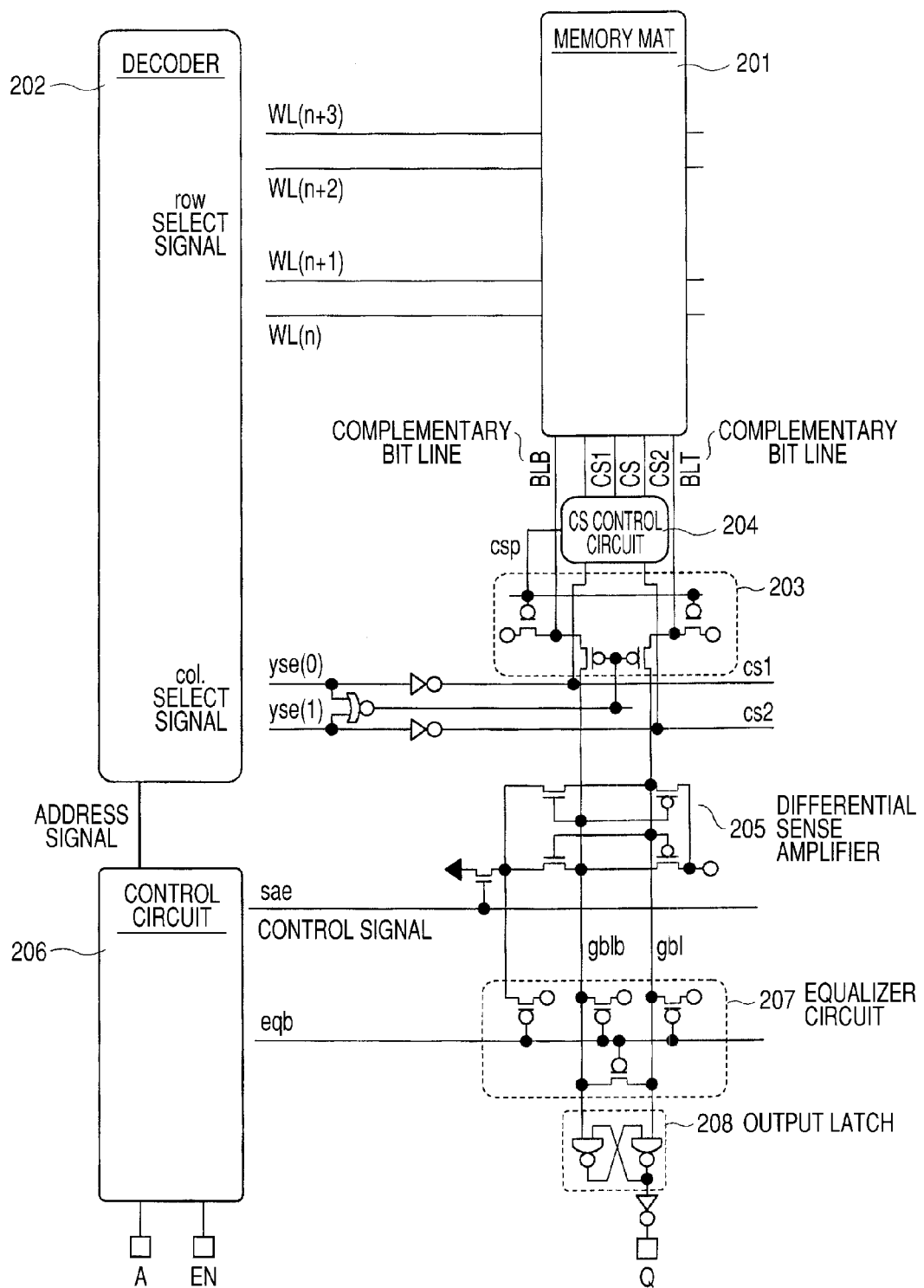
FIG. 2 is a diagram showing the configuration of a ROM in the semiconductor integrated circuit device according to the first embodiment of the present invention.
Figure 3:
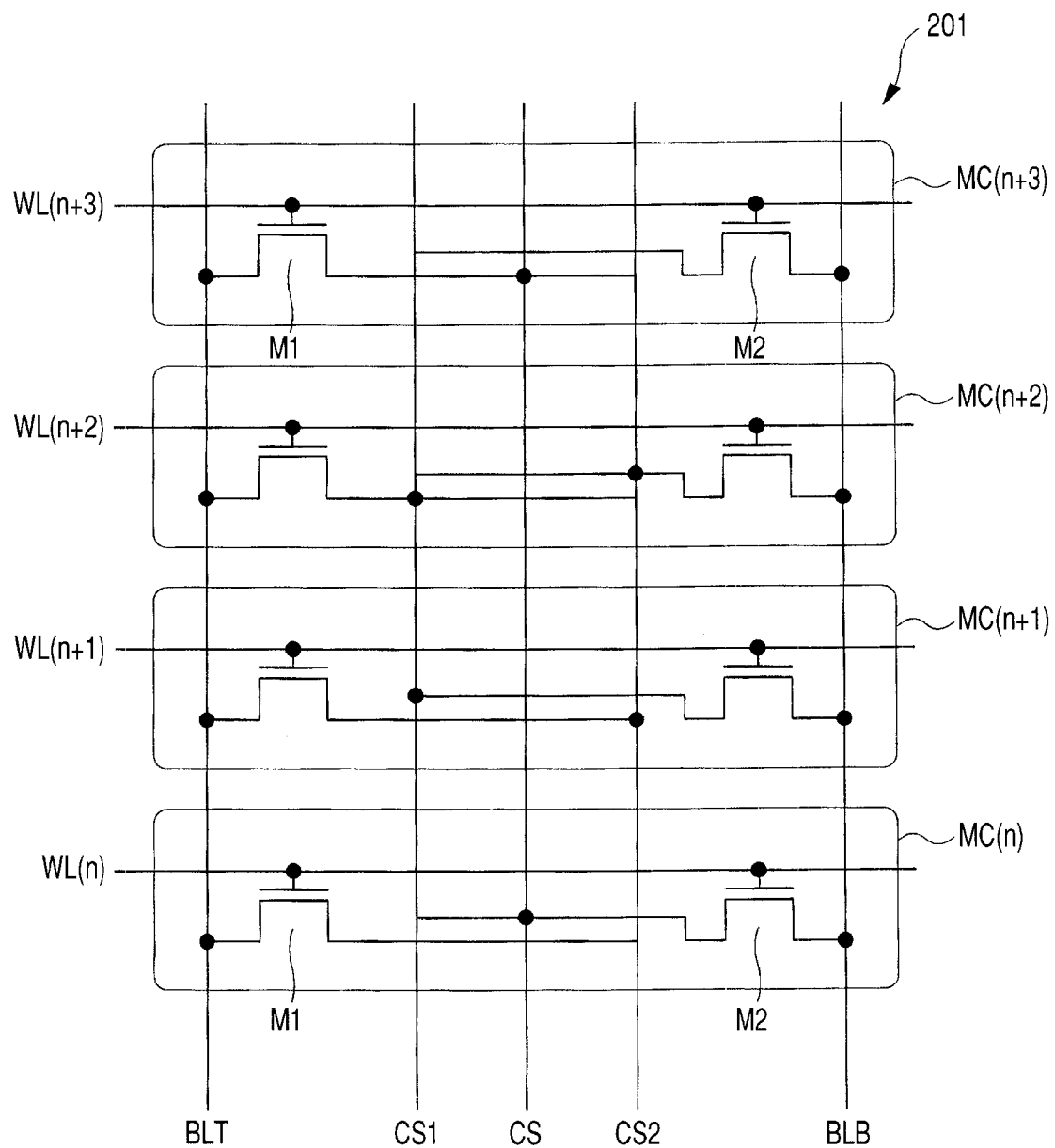
FIG. 3 is a circuit diagram showing the configuration of a memory mat main portion in the semiconductor integrated circuit device according to the first embodiment of the present invention.
Figure 4:
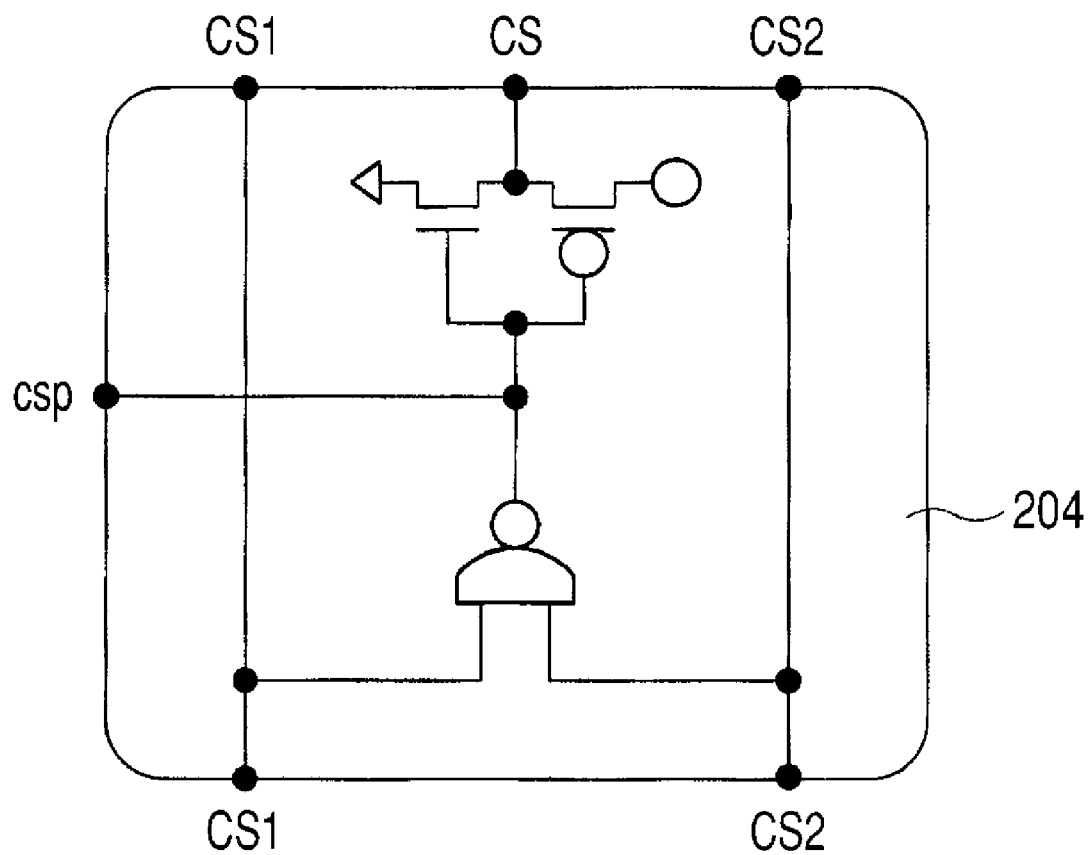
FIG. 4 is a circuit diagram showing a control circuit (L/H output) of a common source line in the semiconductor integrated circuit device according to the first embodiment of the present invention.
Figure 5:
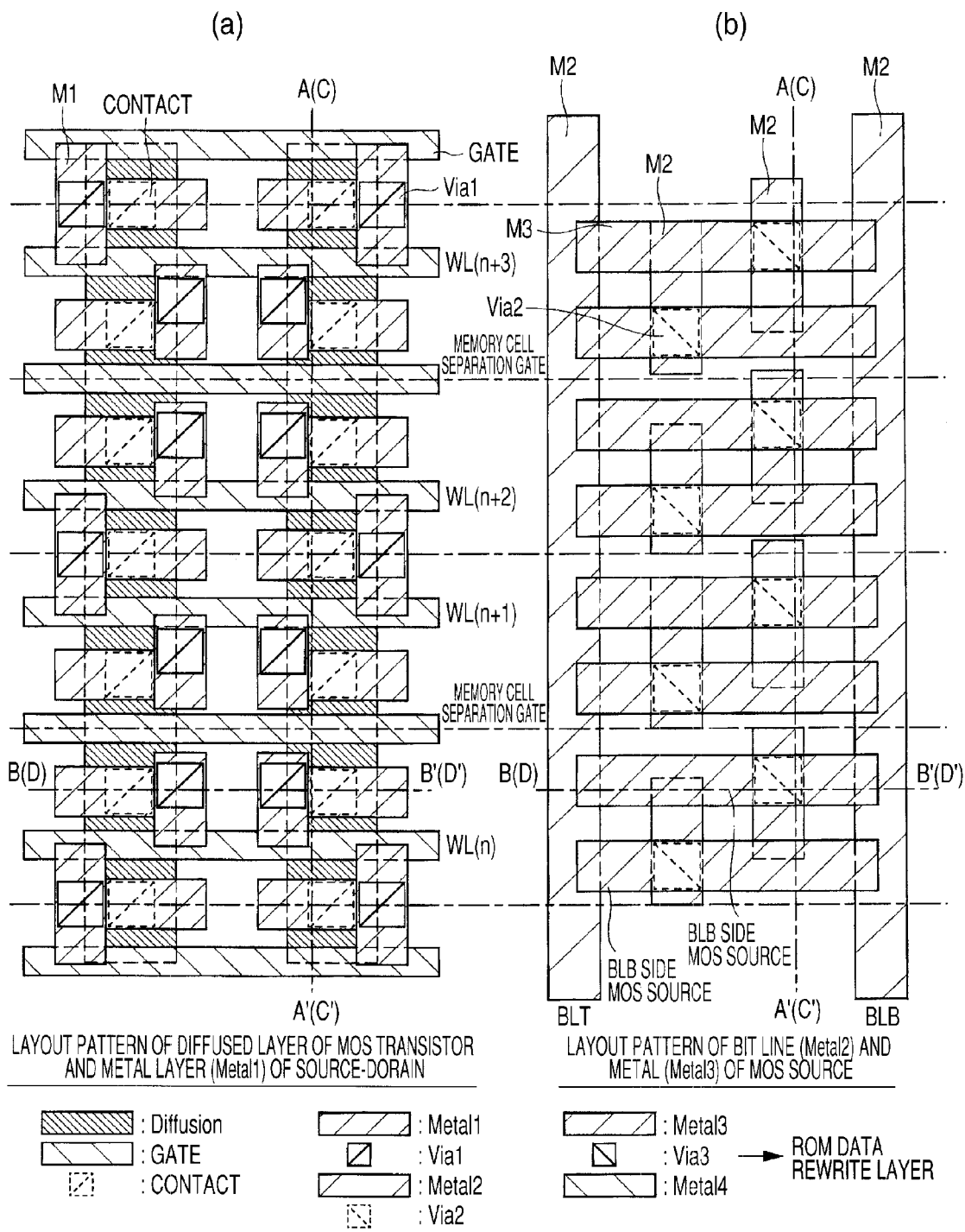
Figure 8:
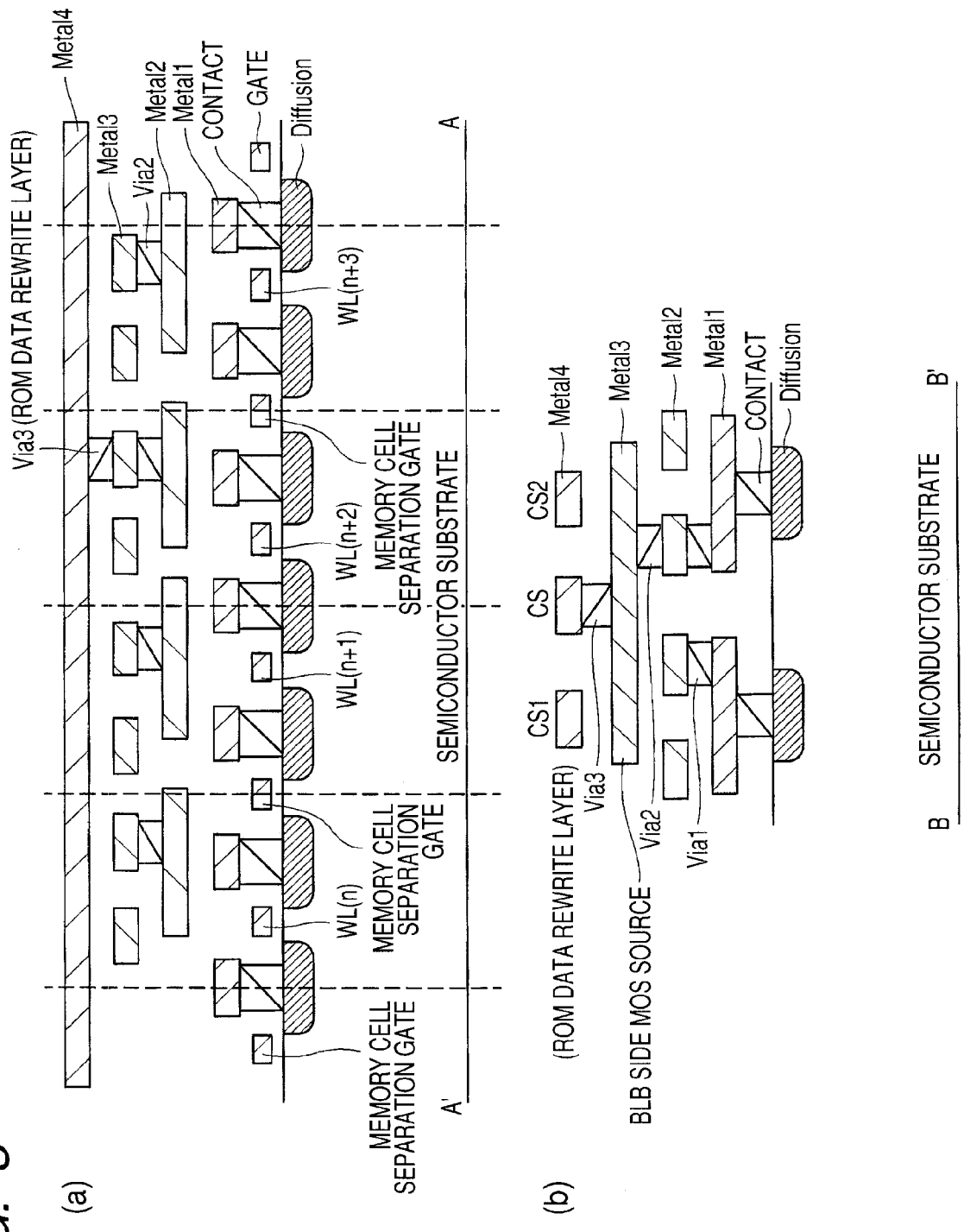
FIG. 8(a) is cross-section along A-A' line of FIGS. 5(a), 5(b) and 6.
FIG. 8(b) is cross-section along B-B' line of FIG. 5(a), FIGS. 5(b) and 6.
Figure 11:
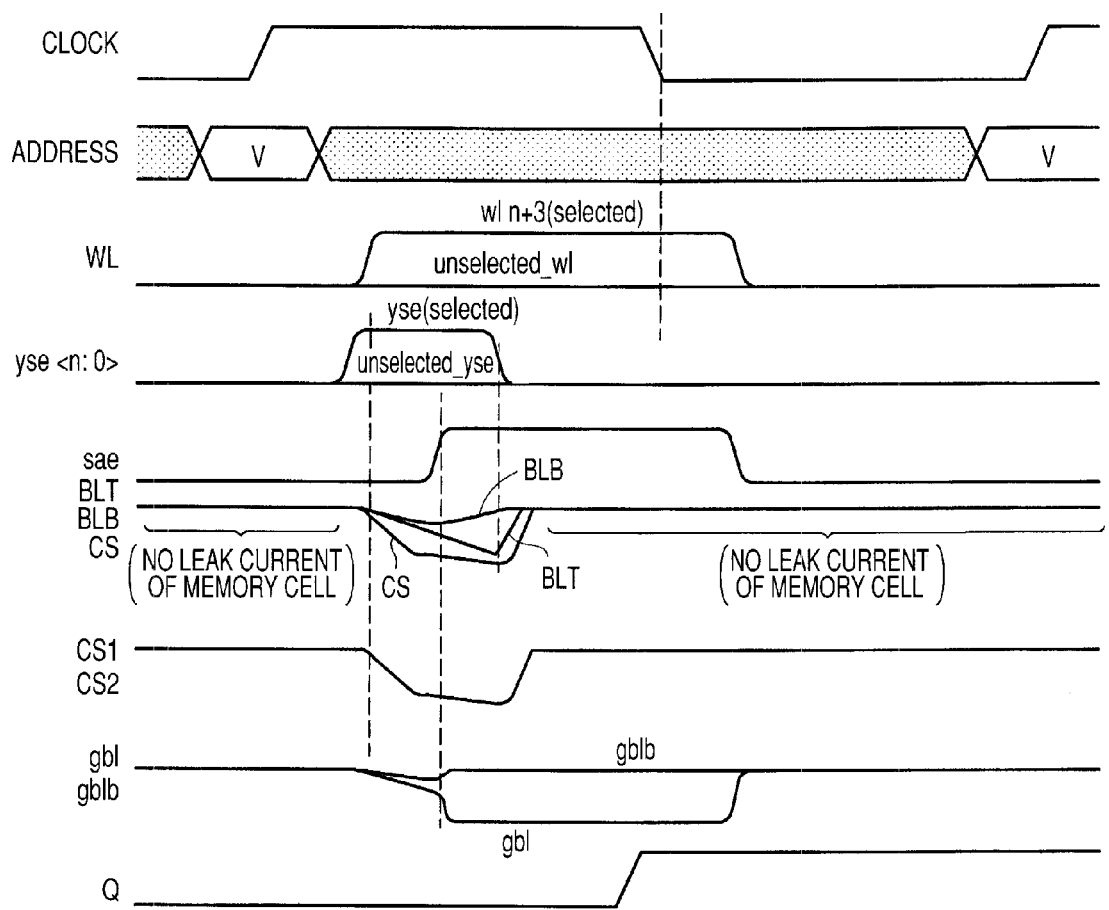
FIG. 11 is a timing chart showing read operation in the semiconductor integrated circuit device according to the first embodiment of the present invention.

FIG. 1 is a block diagram showing the configuration of a semiconductor integrated circuit device according to a first embodiment of the present invention, FIG. 2 is a diagram showing the configuration of a ROM in the semiconductor integrated circuit device according to the first embodiment, FIG. 3 is a circuit diagram showing the configuration of a memory mat main portion, FIG. 4 is a circuit diagram showing a control circuit (L/H output) of a common source line, FIG. 5 is a circuit diagram showing a control circuit (L/H/Hi-Z output) of a common source line, FIGS. 5(a), 5(b), 6, 7(a), 7(b) are layout diagrams of the memory mat, FIGS. 8(a) and 8(b) are cross-section of FIGS. 5(a), 5(b) and 6, FIGS. 9(a) and 9(b) are cross-section of FIGS. 7(a) and 7(b), FIG. 10 is a state diagram showing a selected address, an internal state, and a data output, and FIG. 11 is a timing chart showing read operation.

First, a description will be given of an example of the configuration of a semiconductor integrated circuit device according to the first embodiment with reference to FIG. 1. The semiconductor integrated circuit device according to the first embodiment is directed to, for example, a system LSI 100, and formed on one semiconductor chip through a known semiconductor manufacturing technique. The system LSI 100 includes, for example, a ROM 101, a RAM 102, a CPU (central processing unit) 103, a BUS controller 104, and a user logic various IP 105.

The CPU 103 fetches a command, decrypts the fetched command, and conducts an arithmetic control process. The RAM 102 is used for a work area or a temporary data storage area in conducting the arithmetic control process of the CPU 103. The ROM 101 has the operating program and parameter data of the CPU 103, and the storage information is used in the CPU 103 or the user logic various IP 105. The BUS controller 104 conducts an external bus access control required for the data fetch or the command fetch of the CPU 103.

In the system LSI 100 that is equipped with the user logic various IP 105 and the CPU 103 that reads a system program stored in the ROM 101 and operates, because the performance of the entire system is affected by the read performance from the ROM 101, the ROM 101 of the high-speed operation is required. As the recent trend, the ROM 101 that stored the data that has been stored in the RAM therein, and operates at the same speed as that of the RAM is essential.

Subsequently, the configuration of the ROM 101 will be described with reference to FIG. 2.

The ROM 101 is a nonvolatile memory of the complementary bit line structure, which includes, for example, a memory mat 201, a decoder 202, a column switch 203, a CS control circuit 204, a differential sense amplifier 205, a control circuit 206, an equalizer circuit 207, and an output latch 208. The memory mat 201 has plural memory cells that are arranged in a matrix. The select terminals of the memory cells are coupled with word lines WL, respectively, and the data terminals of the memory cells are coupled with complementary bit lines BLT and BLB. The decoder 202 has a row decoder and a column decoder. The row decoder decodes a row address signal that is supplied from the control circuit 206 to generate a word line select signal. The column decoder decodes a column address signal that is supplied from the control circuit 206 to generate a column select signal. The column switch 203 inputs a column select signal yse, and selects the complementary bit lines BLT and BLB that are designated by the column address signal. The storage information of the memory cell that is selected by the word line select signal is transmitted to complementary global bit lines gb1 and gb1$b$ from the complementary bit line that is selected by the column select signal yse. The differential sense amplifier 205 amplifies the read information that has been transmitted to the global bit lines gb1 and gb1$b$, and outputs the amplified read information to the input of the output latch 208. The output latch 208 latches that signal that has been amplified by the differential sense amplifier 205, and outputs output data Q. The control circuit 206 inputs an enable signal EN and an address signal A to generate an internal access timing signal such as an activation timing signal sae of the decoder 202 and the differential sense amplifier 205. The CS control circuit 204 generates the signals of the common source lines CS, CS1, and CS2 on the basis of the column select signal yse. The signal of the common source lines CS, CS1, and CS2 are transited from H (high) level to L (low) level at the time of selection. The signal of the common source line CS becomes "L" when any signal of the common source lines CS1 and CS2 is "L" level.

FIG. 3 exemplifies a part of the memory mat 201. In the memory mat 201, plural word lines WL, plural pairs of complementary bit lines BLT and BLB, and the common source lines CS, CS1, and CS2 are arranged in a matrix, and the plural memory cells MC are arranged at their cross points. The memory cell MC has a first MOS transistor M1 and a second MOS transistor M2 whose gate electrodes are commonly coupled with a corresponding word line WL. The drain electrodes of both of the MOS transistors M1 and M2 are coupled with the complementary bit lines BLT and BLB, the source electrodes thereof are coupled with any one of the common source lines CS, CS1, and CS2, or floated. A logical value of the storage information is determined according to which common source line CS, CS1, or CS2 being coupled with the source electrodes of the MOS transistors M1 and M2.

For example, in the case of the memory cell MC(n), the gate electrode of the MOS transistor M1 is coupled with the word line WL(n), the drain electrode is coupled with the complementary bit line BLT, and the source electrode is brought in a floating state. The gate electrode of the MOS transistor M2 is coupled with the word line WL(n), the drain electrode is coupled with the complementary bit line BLB, and the source electrode is coupled with the common source line CS. When the common source line CS1 is selected, since the common source line CS becomes "L", the complementary bit line BLT becomes "H", the complementary bit line BLB becomes "L", and the complementary global bit line gb1 becomes "H". When the common source line CS2 is selected, since the common source line CS becomes "L", the complementary bit line BLT becomes "H", the complementary bit line BLB becomes "L", and the complementary global bit line gb1 becomes "H".

Also, in the case of the memory cell MC(n+1), the gate electrode of the MOS transistor M1 is coupled with the word line WL(n+1), the drain electrode is coupled with the complementary bit line BLT, and the source electrode is coupled with the common source line CS2. The gate electrode of the MOS transistor M2 is coupled with the word line WL(n+1), the drain electrode is coupled with the complementary bit line BLB, and the source electrode is coupled with the common source line CS1. When the common source line CS1 is selected, since the common source line CS1 becomes "L", the complementary bit line BLT becomes "H", the complementary bit line BLB becomes "L", and the complementary global bit line gb1 becomes "H". When the common source line CS2 is selected, since the common source line CS2 becomes "L", the complementary bit line BLT becomes "L", the complementary bit line BLB becomes "H", and the complementary global bit line gb1 becomes "L".

Also, in the case of the memory cell MC(n+2), the gate electrode of the MOS transistor M1 is coupled with the word line WL(n+2), the drain electrode is coupled with the complementary bit line BLT, and the source electrode is coupled with the common source line CS1. The gate electrode of the MOS transistor M2 is coupled with the word line WL(n+2), the drain electrode is coupled with the complementary bit line BLB, and the source electrode is coupled with the common source line CS2. When the common source line CS1 is selected, since the common source line CS1 becomes "L", the complementary bit line BLT becomes "L", the complementary bit line BLB becomes "H", and the complementary global bit line gb1 becomes "L". When the common source line CS2 is selected, since the common source line CS2 becomes "L", the complementary bit line BLT becomes "H", the complementary bit line BLB becomes "L", and the complementary global bit line gb1 becomes "H".

Further, in the case of the memory cell MC(n+3), the gate electrode of the MOS transistor M1 is coupled with the word line WL(n+3), the drain electrode is coupled with the complementary bit line BLT, and the source electrode is coupled with the common source line CS. The gate electrode of the MOS transistor M2 is coupled with the word line WL(n+3), the drain electrode is coupled with the complementary bit line BLB, and the source electrode is brought in the floating state. When the common source line CS1 is selected, since the common source line CS becomes "L", the complementary bit line BLT becomes "L", the complementary bit line BLB becomes "H", and the complementary global bit line gb1 becomes "L". When the common source line CS2 is selected, since the common source line CS2 becomes "L", the complementary bit line BLT becomes "L", the complementary bit line BLB becomes "H", and the complementary global bit line gb1 becomes "L".

As described above, the signals of the common source lines CS1 and CS2 change over, thereby making it possible to store two data in one memory cell.

FIG. 4 shows a circuit example of the CS control circuit 204 that generates the signals of the common source lines CS, CS1, and CS2. Only in the case where both of the common sources CS1 and CS2 are "H" level, and the precharge signal csp becomes "L" level. That is, in the case where any one of the common sources CS1 and CS2 is "L" level, the common source CS becomes "L" level, and the precharge signal csp becomes "H" level.

Figure 6:
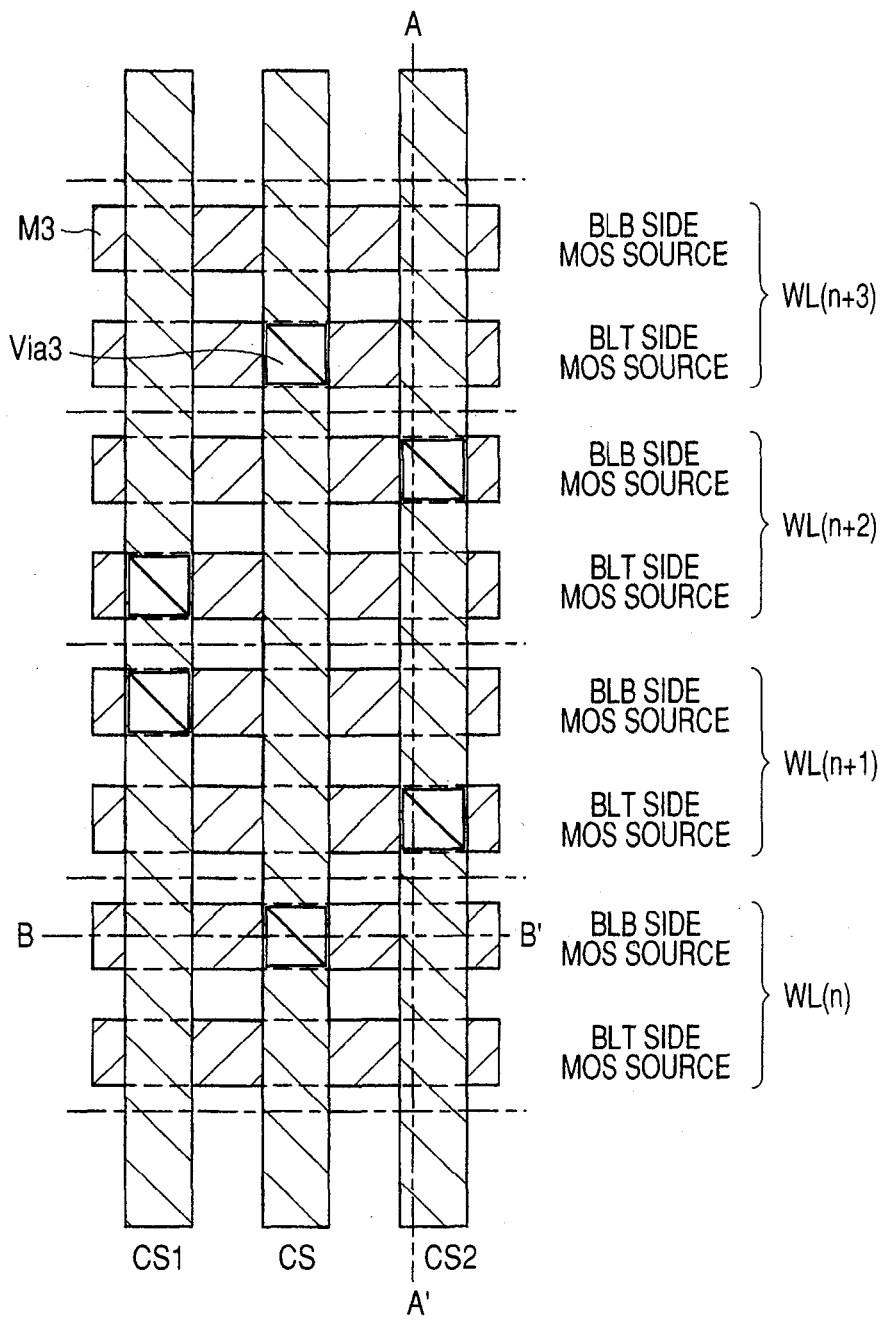

FIGS. 5(a), 5(b) to 7(a), 7(b) show a part of the layout diagram of the memory mat. FIGS. 5(a), 5(b) to 7(a), 7(b) show the layout of the memory mat at a portion corresponding to the equivalent circuit of FIG. 3. FIG. 5(a) shows the layout pattern of the diffusion layer (Diffusion) of the MOS transistor and the metal layer (Metal1) of the source/drain. The diffusion layer has two stripes arranged longitudinally per one column, and the layout pattern is repeated according to the size of the memory mat. The gate layer (GATE) has memory cell separation gates alternately arranged from the word line WL(n) to WL(n+3) laterally, and the layout pattern is repeated according to the size of the memory mat. The word line WL is the gate layer that extends laterally, and the word line resistance increases with an increase in the number of columns, which causes the operating speed to be reduced. In this case, a shunt pattern is arranged in parallel to the column direction, and the gate layer is coupled with the lateral metal wiring of the upper layer, thereby making it possible to prevent an increase in the resistance. An interval at which the shunt pattern is inserted can be appropriately selected as the occasion demands, for example, every four bits or every eight bits. The source/drain of the MOS transistor which is formed by the diffusion layer and the gate layer is coupled with the first metal layer (Metal1) through a contact layer (CONTACT). Also, the vias 1 (Via1) are arranged over the first metal layer of the drain of the MOS transistor at the outer side, and over the first metal layer of the source at the inner side. The bia 1 is a through-hole that couples the first metal layer with the second metal layer. FIG. 5(b) shows the layout pattern of the second metal layer (Metal2) which are the bit lines BLT and BLB, and the third metal layer (Metal3) that is coupled with the source of the MOS transistor. FIG. 5(b) is the layout pattern that is formed as the upper layer of FIG. 5(a). Two layers (Metal2) that form the bit lines BLT and BLB are formed in the longitudinal direction. The bit lines BLT and BLB are coupled with the first metal layer of the drain shown in FIG. 5(a) through the via 1, and the drain of the MOS transistor on the column is coupled with the bit lines BLT and BLB. The second metal layer patterns of the same number as that of the source are arranged over the first metal layer 1 of the source in FIG. 5(a), longitudinally in FIG. 5(b), and pulled up to the respective second metal layers through the vias 1. The third metal layers (Metal3) are arranged over the second metal layers laterally, and coupled with the latter through the vias 2 (Via2). That is, the drains of the MOS transistors in the memory mat are coupled with each other at the right and left by the layout pattern of FIGS. 5(a) and 5(b), independently, and are pulled up to the bit lines BLT and BLB of the second metal layer. The sources of the MOS transistors are all pulled up to the third metal layer independently. FIG. 6 is a layout pattern indicative of the coupling of the third metal layer (Metal3) that is coupled with the source of the MOS transistor with a fourth metal layer (Metal4) that form the common source lines CS, CS1, and CS2. The third metal layer that is coupled with the source of the MOS transistor is identical with the third metal layer of FIG. 5(b). The vias 3 are appropriately arranged at the cross portions of the third metal layers (Metal3) and the fourth metal layers (Metal4) that form the common source lines CS, CS1, and CS2, and the sources of the MOS transistors are coupled with the common source lines CS, CS1, and CS2. The coupling using the vias 3 corresponds to the program of this memory. That is, the information that is stored in the memory cell can be written according to which of the BLB side source and the BLT side source being coupled with the common source lines CS, CS1, and CS2. The information that has been written in FIG. 6 is the same information as that of the equivalent circuit shown in FIG. 3, and the layout pattern having the same coupling relationship.

In the ROM according to the first embodiment, since the ROM information is written according to the formation position of the via 3 after the formation of the third metal layer, the rewrite at the later second half of the manufacturing process can be conducted as compared with the rewrite of the information using the contact layer, the first metal layer, or the second metal layer. That is, since correction of bug can be conducted even in the later process, the free degree of the design choice increases, which is effective in a reduction in the costs.

FIGS. 7(a) and 7(b) show the layout pattern of a modified example that programs the ROM by the third metal layer (Metal3). In this case, the layout pattern up to the second metal layer is identical with that of FIGS. 5(a) and 5(b). In FIG. 7(a), the source of the MOS transistor is pulled up to the second metal layer, independently, as in FIG. 5(b), and also pulled up to the third metal layer arranged laterally through the second via layer, independently. The patterns of the three third metal layers are arranged between the third metal layers of the pair of BLT side MOS source and the BLB side MOS source, independently. The patterns of those three third metal layers are arranged for the purpose of coupling the fourth metal layer (Metal4) that forms the common source lines CS, CS1, and CS2 which are arranged on the upper layer with the source of the MOS transistor. The program of the ROM is realized by appropriately coupling the patterns of the three third metal layers with the third metal layers of the BLT side MOS source and the BLB side MOS source. In this embodiment, the uppermost memory cell couples the pattern of the middle third metal layer with the BLT side MOS source, and the second uppermost memory cell couples the pattern of the left third metal layer with the BLT side MOS source, and couples the pattern of the right third metal layer with the BLB side MOS source. The third uppermost memory cell couples the left third metal layer with the BLB side MOS source, and couples the right third metal layer with the BLT side MOS source. The lowermost memory cell couples the pattern of the middle third metal layer with the BLB side MOS source. The three metal layers are appropriately provided with the coupling wirings as described above, thereby enabling the program of the ROM. The wiring pattern in this embodiment is identical with the program pattern of the ROM shown in FIGS. 3 and 6.

FIG. 7(b) is a layout diagram showing the coupling of the fourth metal layers (Metal4) of the upper layer with the third metal layers shown in FIG. 7(a). The third metal layers shown in FIG. 7(b) are identical with the third metal layers shown in FIG. 7(a). The fourth metal layers are arranged in the column direction as three common source lines CS, CS1, and CS2. The respective common source lines CS, CS1, and CS2 are coupled with the pattern of the three third metal layers that are arranged over the third metal layers of the lower layer through the vias 3 (Via3). The vias 3 allow the BLT side MOS sources and the BLB side MOS sources to be coupled with any one of the common source lines CS, CS1, and CS2, to thereby complete a pattern as the ROM. In this embodiment, since the ROM information is written according to the formation position of the third metal layer, the rewrite at the later second half of the manufacturing process can be conducted as compared with the rewrite of the information using the contact layer, the first metal layer, or the second metal layer as in the embodiment shown in FIGS. 5(a), 5(b), and 6. That is, since correction of bug can be conducted even in the later process, the free degree of the design choice increases, which is effective in a reduction in the costs.

FIG. 8(a) is cross-section along A-A' line of FIGS. 5(a), 5(b) and 6, and FIG. 8(b) is cross-section along B-B' line of FIG. 5(a), FIGS. 5(b) and 6.

Figure 9:
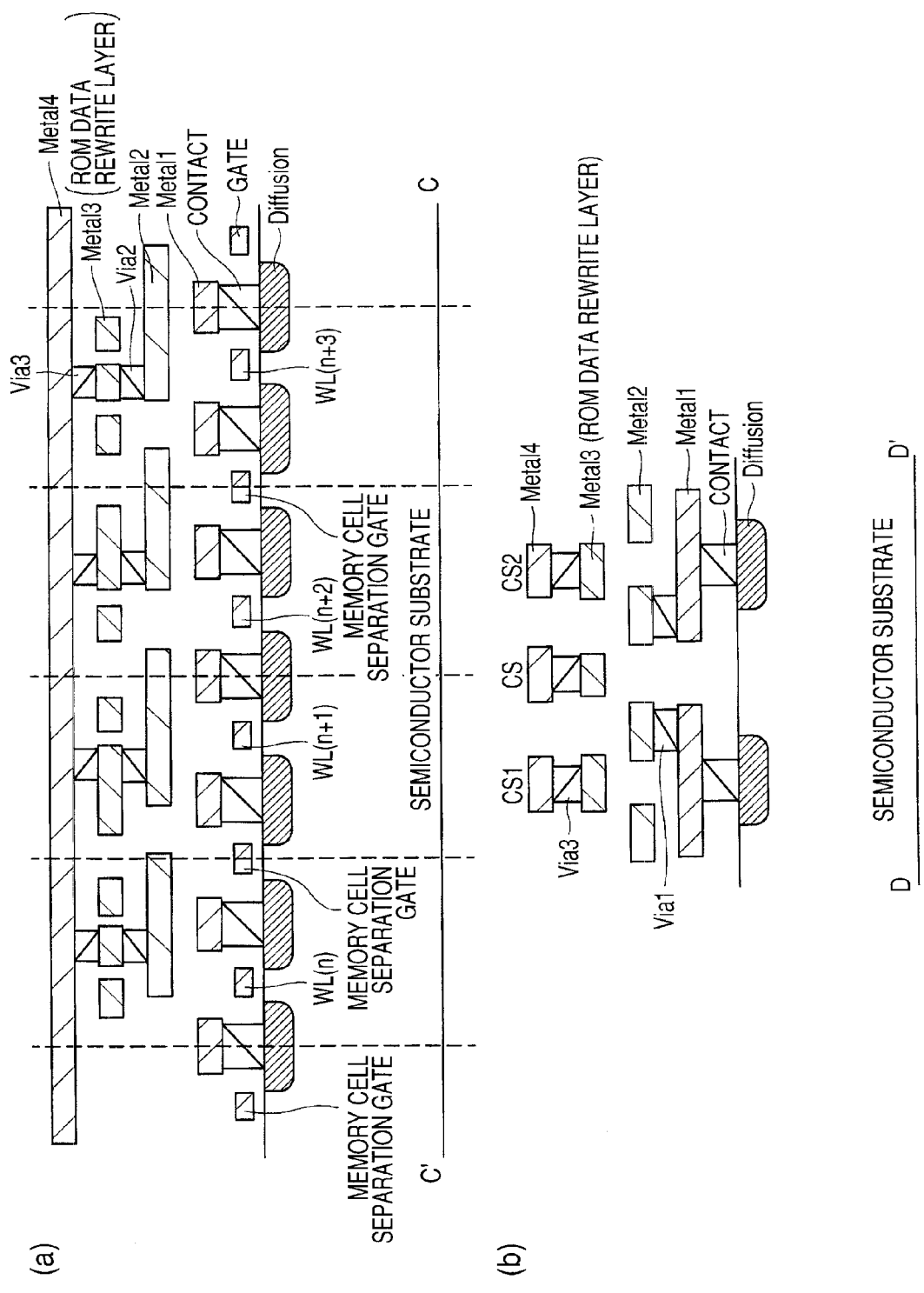
FIG. 9(a) is a cross-section along C-C' line of FIGS. 7(a) and 7(b)
FIG. 9(b) is a cross-section along D-D' line of FIGS. 7(a) and 7(b)

FIG. 9(a) is a cross-section along C-C' line of FIGS. 7(a) and 7(b), and FIG. 9(b) is a cross-section along D-D' line of FIGS. 7(a) and 7(b).

FIG. 10 shows an example of the relationship of the selected address A, the states of the common source lines CS, CS1, and CS2 of the ROM, and data output Q. For example, the word line WL(n) is selected when the read address is "0" and "1", the common source line CS1 is selected when the read address is "0", and the common source line CS2 is selected when the read address is "1". That is, for example, when the address is "0" and "1", the selected word line is WL(n), and the memory cell that conducts read is identical, but the read data is different according to the select states of the common source lines CS, CS1, and CS2.

FIG. 11 exemplifies the read operation timing of the ROM 101. A clock signal defines the access cycle of the ROM 101. The clock signal is a high-speed clock having a frequency that is identical with or a fraction of the frequency of an operating reference clock signal of the CPU 103. The WL signal is generically named "word line". Symbol "yse<n:0>" generically names the column select signal. The access cycle is defined by one cycle of the clock signal. The address signal is made valid (V) at the beginning of the access cycle. Then, the column select operation starts, and the word line select operation starts. The complementary bit lines BLT, BLB, and the common source lines CS, CS1, CS2 are precharged to a supply voltage Vdd until or immediately after the arrival of the word line select timing. Then, the operation of precharging the complementary bit lines BLT and BLB stops, and the common source lines CS, CS1, and CS2 start to be discharged at timing later than the stoppage of the precharge operation. In this situation, the common source line CS1 or CS2 becomes "L" level. CS1="L" is satisfied when yse(0)="H", and CS2="L" is satisfied when yse(1)="H", After the bit line precharge operation stops, and the common source lines CS, CS1, and CS2 are discharged, any one of the complementary bit lines BLT and BLB is discharged according to the information storage state of the memory cell MC that has been selected by the word line WL, that is, which of the common source lines CS, CS1, and CS2 being coupled with the sources of the MOS transistors M1 and M2. The differential sense amplifier 205 detects its change, and complementarily drives the complementary global bit lines gb1 and gb1b. Complementary signals that appear in the complementary global bit lines gb1 and gb1b are latched by the output latch 208 to decide the read data Q.

The column select operation is completed after the amplifying operation of the differential sense amplifier 205 is decided. In synchronism with the decision, the complementary bit lines BLT and BLB, and the common source lines CS, CS1, and CS2 are again precharged to the supply voltage Vdd.

Therefore, according to the semiconductor integrated circuit device of this embodiment, because the layout that increases the number of common source lines without changing the number of MOS transistors is implemented, the memory cell area corresponding to the number of wirings is required. However, plural data values can be stored in the same memory cell.

Second Embodiment

Figure 12:
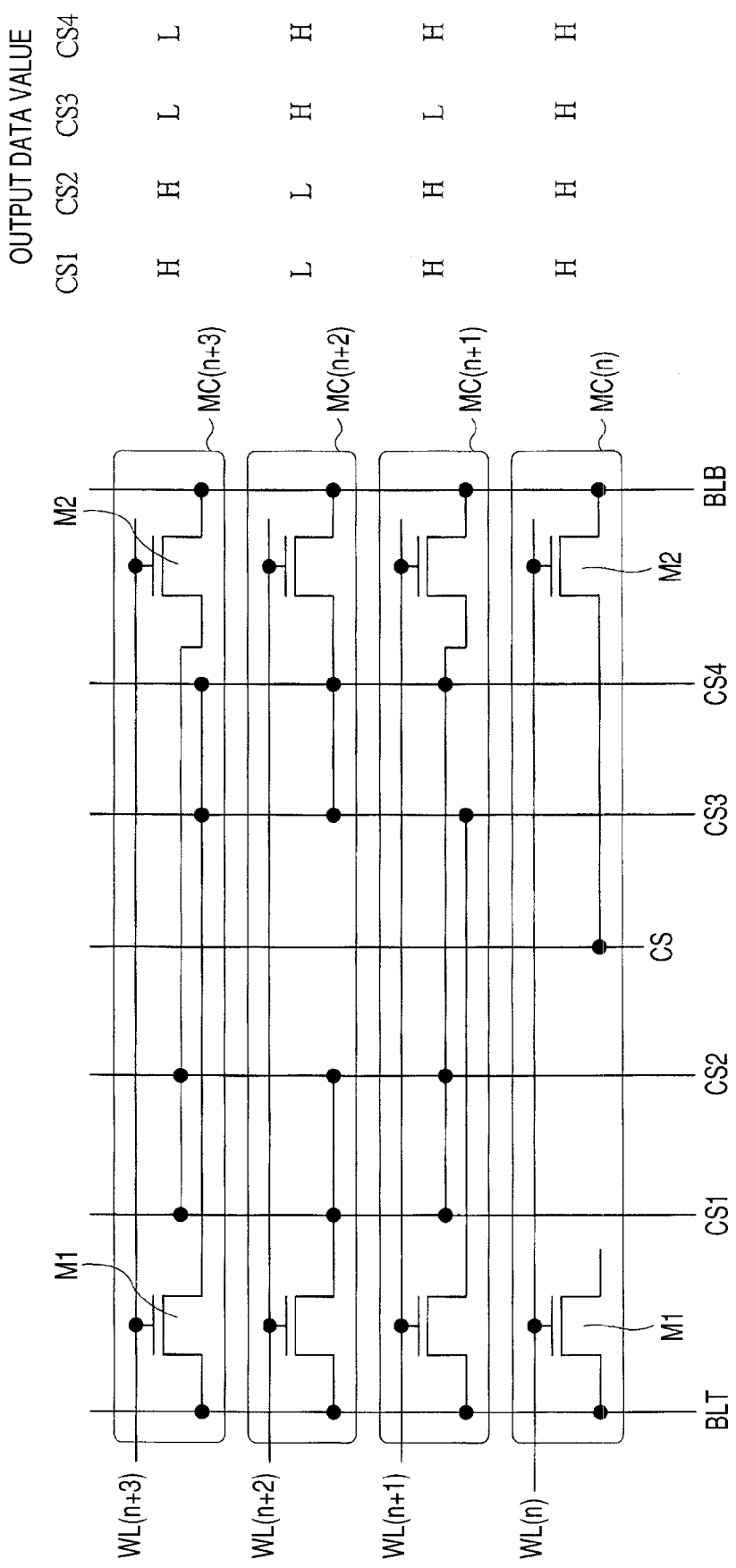
FIG. 12 is a circuit diagram showing the configuration of a memory mat main portion in a semiconductor integrated circuit device according to a second embodiment of the present invention.
Figure 13:
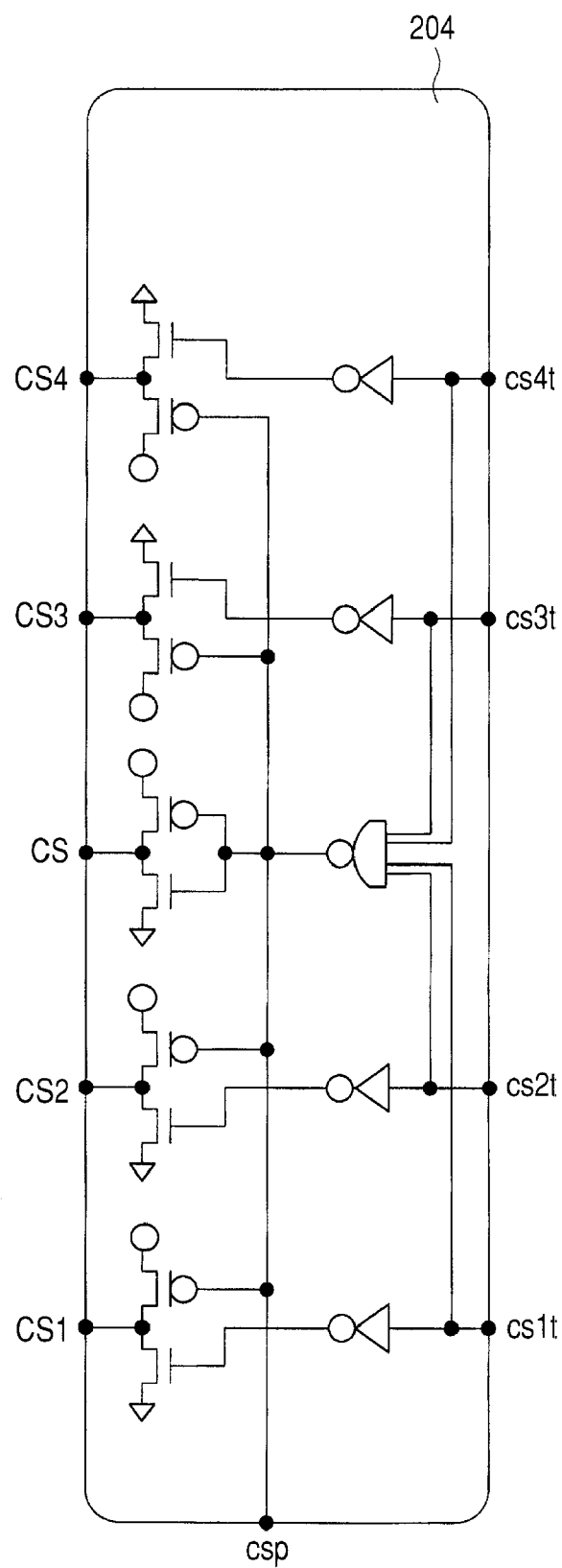
FIG. 13 is a circuit diagram showing a control circuit (L/H/Hi-Z output) of a common source line in the semiconductor integrated circuit device according to the second embodiment of the present invention.

FIG. 12 is a circuit diagram showing the configuration of a memory mat main portion in a semiconductor integrated circuit device according to a second embodiment of the present invention. FIG. 13 is a circuit diagram showing a control circuit (L/H/Hi-Z output) of a common source line. FIG. 14 is a state diagram showing a selected address, an internal state, and a data output.

The semiconductor integrated circuit device according to the second embodiment is another structural example of the ROM 101 within the system LSI 100 in the first embodiment. FIG. 12 exemplifies a part of the memory mat that forms the ROM 101. The memory mat of the ROM in the second embodiment has plural word lines WL, plural pairs of bit lines BLT, BLB, and common source lines CS, CS1, CS2, CS3, and CS4 arranged in a matrix. Plural memory cells MC are arranged at cross points of those lines. The memory cell MC has a first MOS transistor M1 and a second MOS transistor M2 whose gate electrodes are commonly coupled with a corresponding word line WL. Both of the MOS transistors M1 and M2 have drain electrodes coupled with the complementary bit lines BLT and BLB, source electrodes coupled with any one of the common source lines CS, CS1, CS2, CS3, and CS4, or floated. The logical values of the storage information are determined according to which of the common source lines CS, CS1, CS2, CS3, and CS4 being coupled with the source electrodes of the MOS transistors M1 and M2.

For example, in the case of the memory cell MC(n), the gate electrode of the MOS transistor M1 is coupled with the word line WL(n), the drain electrode is coupled with the complementary bit line BLT, and the source electrode is brought in a floating state. The gate electrode of the MOS transistor M2 is coupled with the word line WL(n), the drain electrode is coupled with the complementary bit line BLB, and the source electrode is coupled with the common source line CS. When any one of the common source lines CS1, CS2, CS3, and CS4 is selected, since the common source line CS becomes "L", the complementary bit line BLT becomes "H", the complementary bit line BLB becomes "L", and the complementary global bit line gb1 becomes "H".

Also, in the case of the memory cell MC(n+1), the gate electrode of the MOS transistor M1 is coupled with the word line WL(n+1), the drain electrode is coupled with the complementary bit line BLT, and the source electrode is coupled with the common source line CS3. The gate electrode of the MOS transistor M2 is coupled with the word line WL(n+1), the drain electrode is coupled with the complementary bit line BLB, and the source electrode is coupled with the common source lines CS1, CS2, and CS. When any one of the common source lines CS1, CS2, and CS4 is selected, since the common source lines CS1, CS2, and CS4 becomes "L", the complementary bit line BLT becomes "H", the complementary bit line BLB becomes "L", and the complementary global bit line gb1 becomes "H". When the common source line CS3 is selected, since the common source line CS3 becomes "L", the complementary bit line BLT becomes "L", the complementary bit line BLB becomes "H", and the complementary global bit line gb1 becomes "L".

Also, in the case of the memory cell MC(n+2), the gate electrode of the MOS transistor M1 is coupled with the word line WL(n+2), the drain electrode is coupled with the complementary bit line BLT, and the source electrode is coupled with the common source lines CS1 and CS2. The gate electrode of the MOS transistor M2 is coupled with the word line WL(n+2), the drain electrode is coupled with the complementary bit line BLB, and the source electrode is coupled with the common source lines CS3 and CS4. When the common source lines CS1 and CS2 is selected, since the common source lines CS1 and CS2 become "L", the complementary bit line BLT becomes "L", the complementary bit line BLB becomes "H", and the complementary global bit line gb1 becomes "L". When any one of the common source lines CS3 and CS4 is selected, since the common source lines CS3 and CS4 become "L", the complementary bit line BLT becomes "H", the complementary bit line BLB becomes "L", and the complementary global bit line gb1 becomes "H".

Further, in the case of the memory cell MC(n+3), the gate electrode of the MOS transistor M1 is coupled with the word line WL(n+3), the drain electrode is coupled with the complementary bit line BLT, and the source electrode is coupled with the common source lines CS3 and CS4. The gate electrode of the MOS transistor M2 is coupled with the word line WL(n+3), the drain electrode is coupled with the complementary bit line BLB, and the source electrode is coupled with the common source lines CS1 and CS2. When any one of the common source lines CS1 and CS2 is selected, since the common source lines CS1 and CS2 become "L", the complementary bit line BLT becomes "H", the complementary bit line BLB becomes "L", and the complementary global bit line gb1 becomes "H". When any one of the common source lines CS3 and CS4 is selected, since the common source lines CS3 and CS4 become "L", the complementary bit line BLT becomes "L", the complementary bit line BLB becomes "H", and the complementary global bit line gb1 becomes "L".

As described above, the signals of the common source lines CS1 and CS2 change over, thereby making it possible to store four data (16 bits) in one memory cell. However, it is necessary to set only the selected common source line to "L", and other common source lines to "Hi-Z (high impedance) during the read operation. During standby, all of the common source lines are set to "H", and all of the word lines are set to "L".

Similarly, in the memory mat according to the second embodiment, by using the same manner as that of the layout pattern shown in FIGS. 5(a), 5(b), 6 or 7(a) and 7(b), the common source lines of fourth metal layer CS, CS1, CS2, CS3, and CS4 are provided, thereby conducting the ROM program such that the coupling to the source of the MOS transistor is performed through presence/absence of via 3, or the coupling of the third metal layer.

FIG. 13 shows a circuit example of the CS control circuit 204 that generates the signals of the common source lines CS, CS1, CS2, CS3, and CS4. FIG. 13 is a circuit of an L/H/Hi-Z (high impedance) output.

FIG. 14 shows an example of a relationship of a selected address A, a ROM internal state, and the data output Q. For example, the word line WL (n) is selected when the read address is "0", "1", "2", and "3", the common source line CS1 is selected when the read address is "0", the common source line CS2 is selected when the read address is "1", the common source line CS3 is selected when the read address is "2", and the common source line CS4 is selected when the read address is "3".

Third Embodiment

Figure 15:
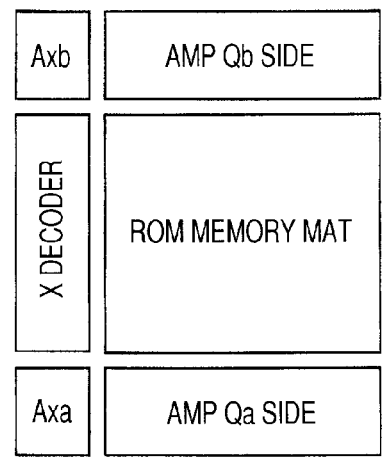
FIG. 15 is a block diagram showing an outline configuration of a ROM in a semiconductor integrated circuit device according to a third embodiment of the present invention.
Figure 16:
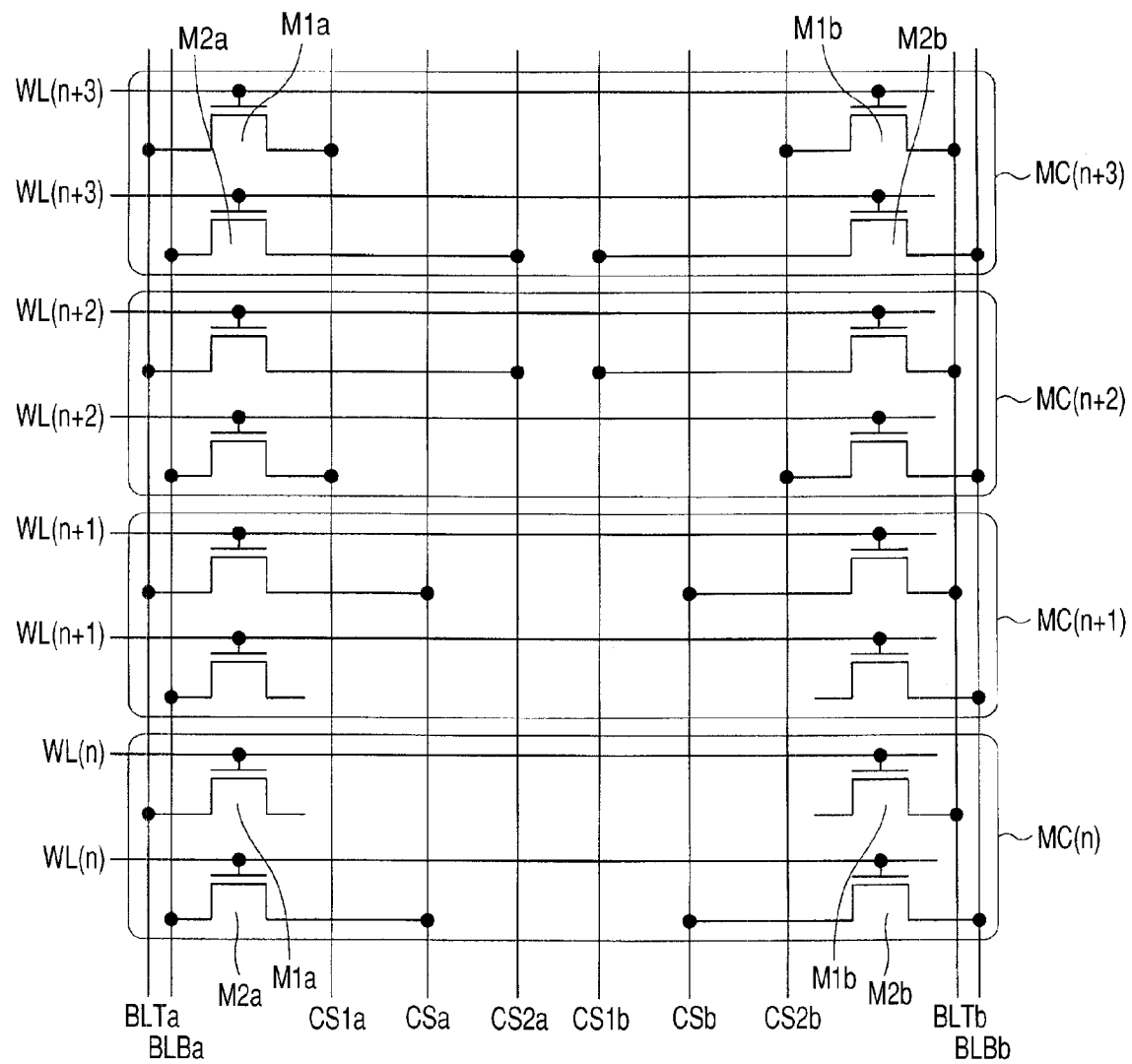
FIG. 16 is a circuit diagram showing the configuration of a memory mat main portion in the semiconductor integrated circuit device according to the third embodiment of the present invention.
Figure 18:
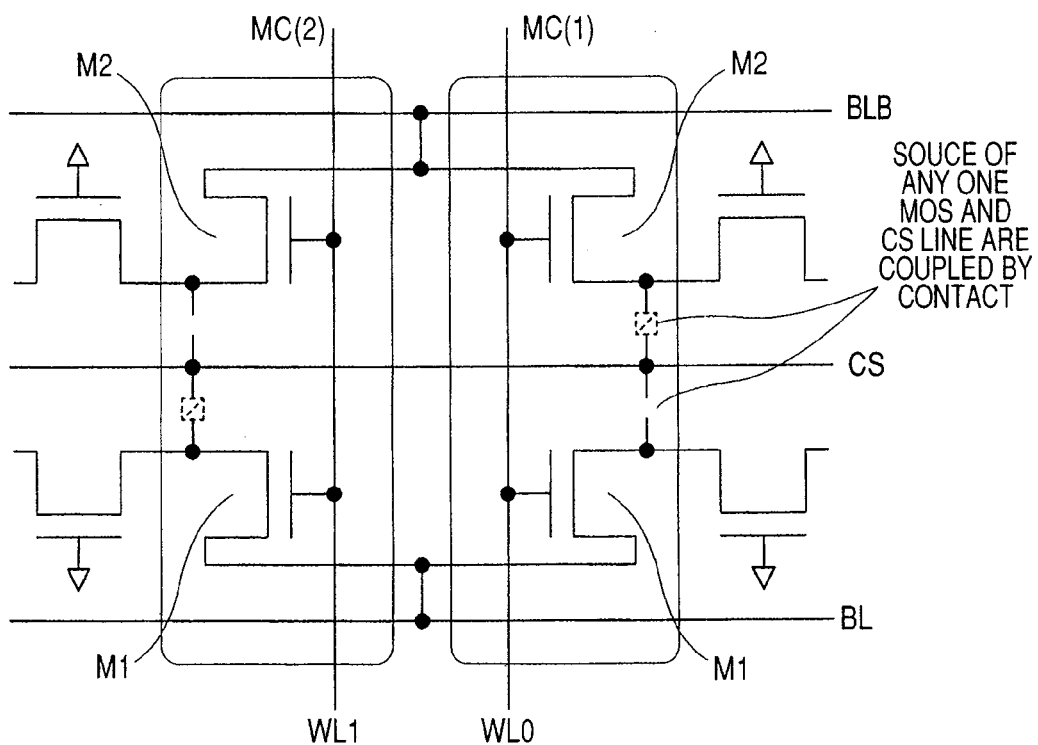
FIG. 18 is a diagram showing an example of the configuration of a ROM memory cell that has been studied as the premise of the present invention.
Figure 20:
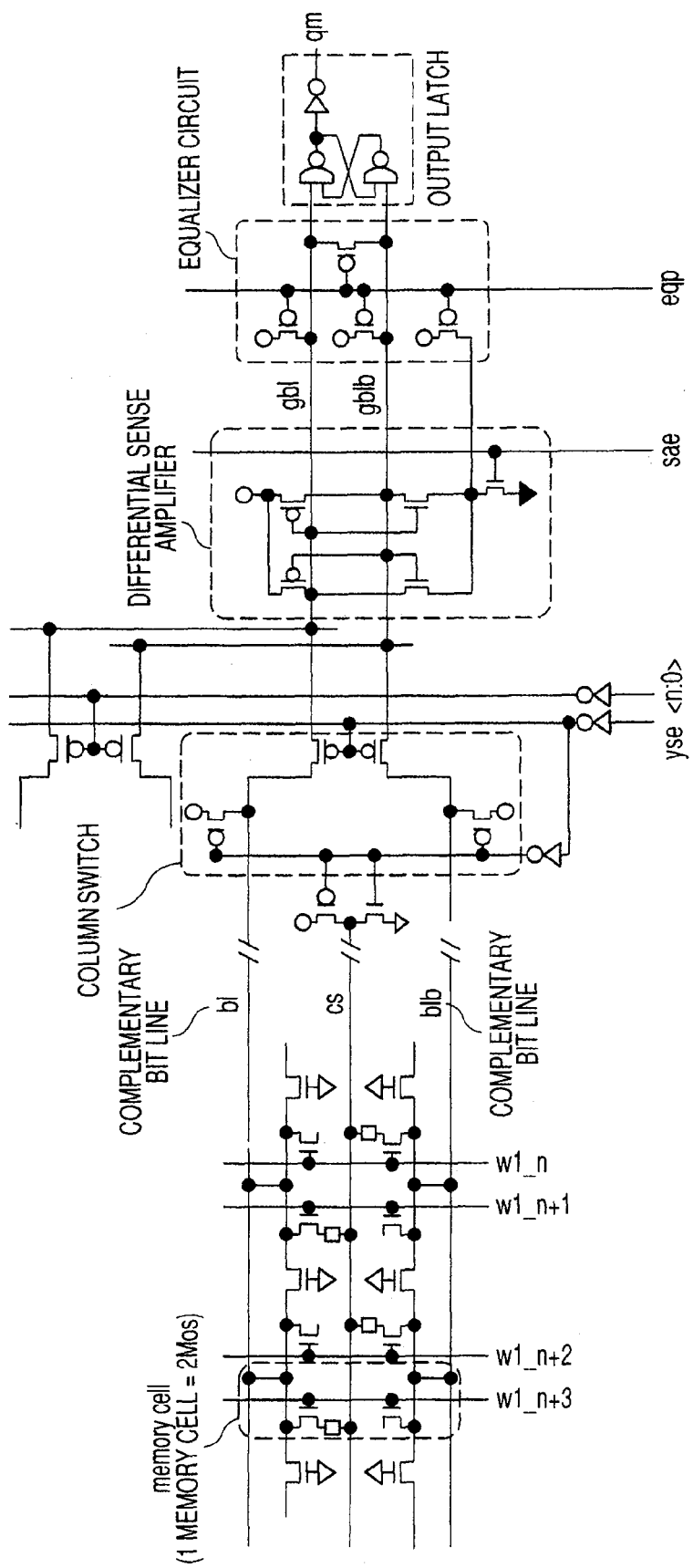
FIG. 20 is a circuit diagram showing an example of the configuration of the ROM memory cell and a differential sense amplifier which have been studied as the premise of the present invention.
Figure 21:
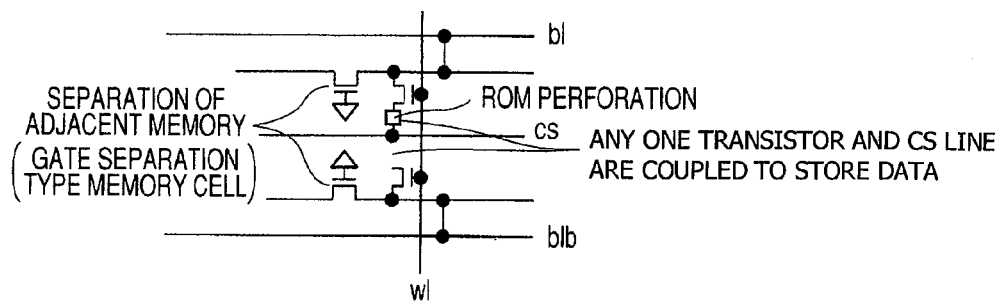
FIG. 21 is a diagram showing an example of the coupling of the ROM memory cell which has been studied as the premise of the present invention.
Figure 22:
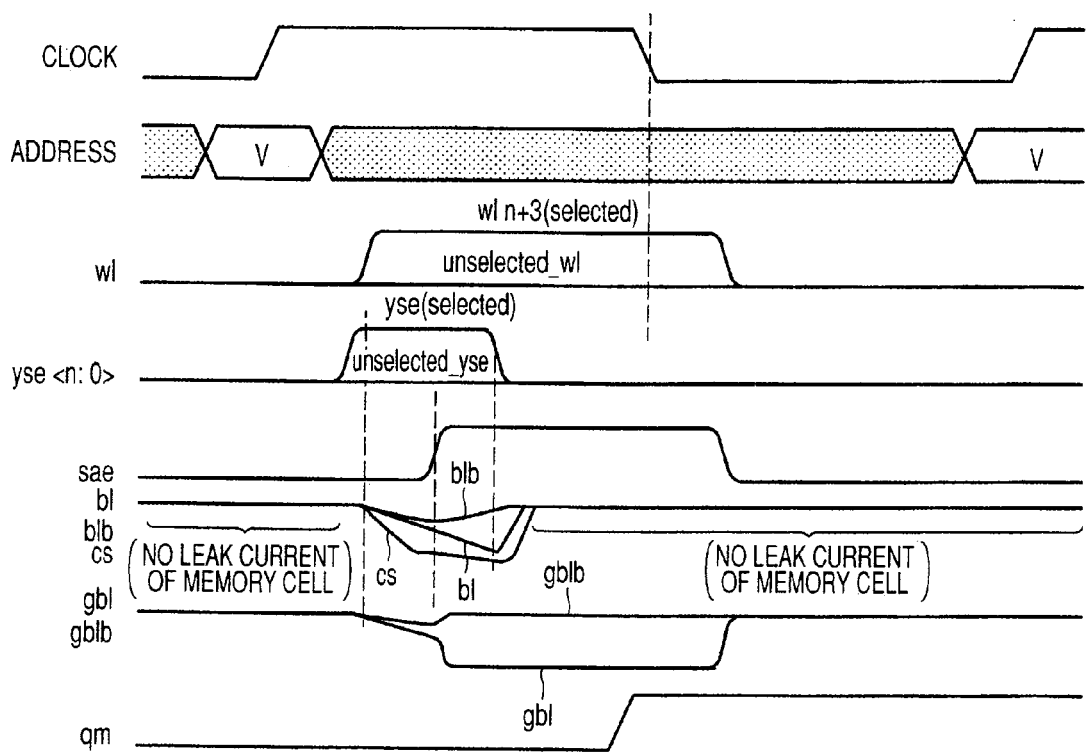
FIG. 22 is a timing chart of the read operation of the ROM memory cell through a common source control system that has been studied as the premise of the present invention.

FIG. 15 is a block diagram showing the outline configuration of a ROM in a semiconductor integrated circuit device according to a third embodiment of the present invention. FIG. 16 is a circuit diagram showing the configuration of a memory mat main portion. FIG. 17 is a state diagram showing a selected address, an internal state, and a data output.

The semiconductor integrated circuit device according to the third embodiment is another structural example of the ROM 101 within the system LSI 100 in the first embodiment. FIG. 15 exemplifies a dual port ROM which is capable of reading the data of different addresses at the same time. Address terminals A are arranged at a Qa side and a Qb side, independently, thereby enabling the dual read.

FIG. 16 exemplifies a part of the memory mat that forms the ROM 101. The memory mat of the ROM in the third embodiment has plural word lines WL, plural pairs of bit lines BLTa, BLBa, BLTb, BLBb, and common source lines CSa, CS1a, CS2a, CSb, CS1b, and CS2b arranged in a matrix. Plural memory cells MC are arranged at cross points of those lines. The memory cell MC has a first MOS transistor M1a, a second MOS transistor M2a, a third MOS transistor M1b, and a fourth MOS transistor M2b whose gate electrodes are commonly coupled with a corresponding word line WL. The drain electrodes of the MOS transistors M1a and M2a are coupled with the complementary bit lines BLTa and BLBa, and the drain electrodes of the MOS transistors M1b and M2b are coupled with the complementary bit lines BLTb and BLBb. The source electrodes of the MOS transistors M1a and M2a are coupled with any one of the common source lines CSa, CS1a, and CS2a, or floated. The source electrodes of the MOS transistors M1b and M2b are coupled with any one of the common source lines CSb, CS1b, and CS2b, or floated. The logical values of the storage information are determined according to which of the common source lines being coupled with the source electrodes of the MOS transistors M1a, M2a, M1b, and M2b.

As described above, the complementary bit lines BLTa, BLBa, the MOS transistors M1a, M2a, and the common source lines CSa, CS1a, CS2a at the a-side, and the complementary bit lines BLTb, BLBb, the MOS transistors M1b, M2b, and the common source lines CSb, CS1b, CS2b at the b-side can be controlled, independently. This enables the data of the different addresses to being read at the same time. However, it is necessary to set only the selected common source line to "L", and set other common source lines to Hi-Z (high impedance) during the read operation. During standby, all of the common source lines are set to "H", and all of the word lines are set to "L".

Needless to say, in the memory mat according to the third embodiment, by using the same manner as that of the layout pattern shown in FIGS. 5(a), 5(b), 6 or 7(a) and 7(b), the common source lines CSa, CS1a, CS2a, CSb, and CS1b, and CS2b of the fourth metal layer are provided, and the ROM program can be conducted such that the coupling to the source of the MOS transistor is performed through presence/absence of via 3, or the coupling of the third metal layer.

FIG. 17 shows an example of a relationship of a selected address A, a ROM internal state, and the data output Q. For example, the word line WL (n) is selected when the read address is "0", "1", "2", and "3", the common source lines CS1a and CS1b are selected when the read address is "0", and the common source lines CS2a and CS2b are selected when the read address is "1". In FIG. 17, A1 and A0 are column select, and A3 and A2 are row select.

The present invention has been described above in detail on the basis of the embodiments. However, the present invention is not limited to the above embodiments, but various modifications can be made without deviating from the spirit of the invention. Also, the above first to third embodiments can be appropriately combined together.

The present invention can be widely applied to the semiconductor integrated circuit device having a nonvolatile memory, for example, a microcomputer or a system LSI.

What is claimed is:

1. A semiconductor integrated circuit device having a nonvolatile memory cell, comprising:
   a word line;
   complementary bit lines including first and second bit lines;
   two or more N common source lines; and
   a memory cell that is coupled with the word line and the complementary bit lines;
   wherein the nonvolatile memory cell includes first and second transistors,
   wherein the gates of the first and second transistors are coupled with the word line,
   wherein the source or drain of the first transistor is coupled with the first bit line;
   wherein the source or drain of the second transistor is coupled with the second bit line;
   wherein the source or the drain which are different from the source or the drain coupled with the bit lines of the first and second transistors is coupled with any one of the first to N common source lines, or brought in a floating state to store storage information in the nonvolatile memory cell.

2. The semiconductor integrated circuit device according to claim 1,
   wherein the first common source line is transited to a first potential, and any one of the N common source lines is transited to the first potential during the read operation of the memory cell.

3. The semiconductor integrated circuit device according to claim 1,
   wherein the memory cell stores data of N bits therein.

4. The semiconductor integrated circuit device according to claim 1,
   wherein the write of data in the memory cell is conducted by coupling an M-th metal wiring layer that forms the first common source line and the N common source lines with an (M−1)-th metal wiring layer that is coupled with the drains or sources of the first and second transistors.

5. A semiconductor integrated circuit device having a nonvolatile memory, the nonvolatile memory comprising:
   a word line;
   complementary bit lines including first and second bit lines;
   first, second, and third common source lines;
   a memory cell that is coupled with the word line and the complementary bit line; and
   a differential sense amplifier that is coupled with the complementary bit line,
   wherein the memory cell includes first and second transistors,
   wherein the gate electrodes of the first and second transistors are coupled with the word line,
   wherein the drain electrode of the first transistor is coupled with the first bit line,
   wherein the drain electrode of the second transistor is coupled with the second bit line, and
   wherein each source electrode of the first and second transistors is coupled with any one of the first, second, and third common source lines, or brought in a floating state, to store memory information in the memory cell.

6. The semiconductor integrated circuit device according to claim 5,
   wherein the first common source line is transited to a first potential, and any one of the second and third common source lines is transited to the first potential during the read operation of the memory cell.

7. The semiconductor integrated circuit device according to claim 5,
   wherein the nonvolatile memory stores two data within the one memory cell.

8. The semiconductor integrated circuit device according to claim 5,
   wherein the write of data in the memory cell is conducted by coupling an M-th metal wiring layer that forms the first common source line, and the second and third common source lines with an (M−1)-th metal wiring layer that is coupled with the drains of the first and second transistors.

9. A semiconductor integrated circuit device having a nonvolatile memory, the nonvolatile memory comprising:
   a word line;
   complementary bit lines including first and second bit lines;
   first to fifth common source lines;
   a memory cell that is coupled with the word line and the complementary bit lines; and
   a differential sense amplifier that is coupled with the complementary bit lines,
   wherein the memory cell includes a first and second transistors,
   wherein the gate electrodes of the first and second transistors are coupled with the word line,
   wherein the drain electrode of the first transistor is coupled with the first bit line,
   wherein the drain electrode of the second transistor is coupled with the second bit line, and
   wherein each source electrode of the first and second transistors is coupled with any one or more of the first to fifth common source lines or brought in a floating state, to store memory information in the memory cell.

10. The semiconductor integrated circuit device according to claim 9,
    wherein the first common source line is transited to a first potential, and any one of the second to fifth common source lines is transited to the first potential during the read operation of the nonvolatile memory.

11. The semiconductor integrated circuit device according to claim 9,
    wherein the nonvolatile memory stores four data within the one memory cell.

12. The semiconductor integrated circuit device according to claim 9,
    wherein the write of data in the memory cell is conducted by coupling an M-th metal wiring layer that forms the first to fifth common source lines with an (M−1)-th metal wiring layer that is coupled with the drains of the first and second transistors.

* * * * *